United States Patent
Maeda et al.

(10) Patent No.: US 10,720,202 B2
(45) Date of Patent: Jul. 21, 2020

(54) APPARATUS FOR MEMORY CONTROL

(71) Applicant: FUJITSU LIMITED, Kawasaki-shi, Kanagawa (JP)

(72) Inventors: Masazumi Maeda, Yokohama (JP); Kazuko Higurashi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/536,360

(22) Filed: Aug. 9, 2019

(65) Prior Publication Data
US 2020/0066322 A1 Feb. 27, 2020

(30) Foreign Application Priority Data
Aug. 21, 2018 (JP) ................. 2018-154713

(51) Int. Cl.
*G11C 11/40* (2006.01)
*G11C 11/409* (2006.01)
*G11C 29/52* (2006.01)
*G06F 13/16* (2006.01)
*G11C 11/4074* (2006.01)
*G11C 11/4078* (2006.01)

(52) U.S. Cl.
CPC ........ *G11C 11/409* (2013.01); *G06F 13/1668* (2013.01); *G11C 11/4074* (2013.01); *G11C 29/52* (2013.01); *G11C 11/4078* (2013.01)

(58) Field of Classification Search
None
See application file for complete search history.

(56) References Cited

U.S. PATENT DOCUMENTS

| | | | |
|---|---|---|---|
| 6,704,675 B1 | 3/2004 | Sakaguchi | |
| 9,070,481 B1* | 6/2015 | Ellis | G11C 29/50008 |
| 2007/0044047 A1* | 2/2007 | Kurihara | G06F 30/367 |
| | | | 716/115 |
| 2015/0120220 A1* | 4/2015 | Wu | H01L 22/20 |
| | | | 702/58 |
| 2016/0179406 A1* | 6/2016 | Gorobets | G11C 11/5628 |
| | | | 711/103 |
| 2016/0180959 A1* | 6/2016 | Darragh | G06F 11/079 |
| | | | 365/185.09 |
| 2020/0075107 A1* | 3/2020 | Huang | G11C 29/50 |

FOREIGN PATENT DOCUMENTS

| | | |
|---|---|---|
| JP | 2001-013200 | 1/2001 |
| JP | 2006-252361 | 9/2006 |

* cited by examiner

*Primary Examiner* — Tan T. Nguyen
(74) *Attorney, Agent, or Firm* — Fujitsu Patent Center

(57) ABSTRACT

An apparatus for memory control includes a data storage area configured to store data indicative of a distribution of total current consumption required for a write operation as measured with respect to one or more nonvolatile memory devices of a first type, and a control apparatus configured to evaluate, based on the data indicative of the distribution, a degree to which a total amount of current consumption required for a write operation with respect to a memory area in a nonvolatile memory device of the same first type, regarding a current flowing from a power supply to the nonvolatile memory device during the write operation, is deviated toward larger total current consumptions in the distribution, thereby determining whether the memory area is satisfactory.

5 Claims, 16 Drawing Sheets

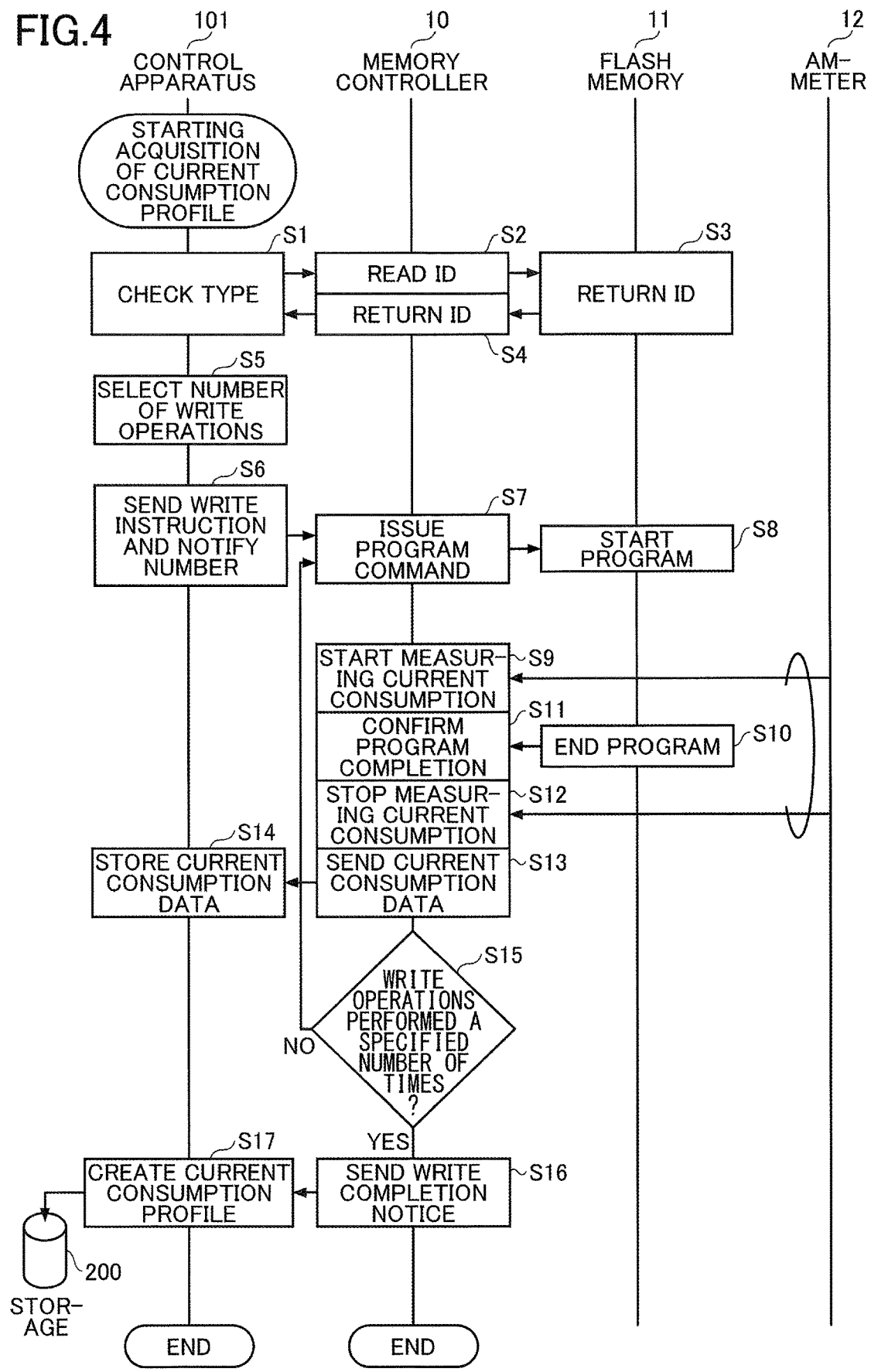

FIG.5

| Table No. | DEVICE TYPE | COMMAND | PROGRAM AREA | PROFILE NAME | NOTE |
|---|---|---|---|---|---|
| 1 | A | Byte Program | 1-Byte | A-1.pro | COMMAND FOR PROGRAMMING 1 BYTE ONLY |
| 2 | | Word Program | 1-Word | A-2.pro | COMMAND FOR PROGRAMMING 1 WORD ONLY |
| 3 | B | Byte Program | 1-Byte | B-1.pro | COMMAND FOR PROGRAMMING 1 BYTE ONLY |
| 4 | | Word Program | 1-Word | B-2.pro | COMMAND FOR PROGRAMMING 1 WORD ONLY |
| 5 | | Buffer Program Confirm(Byte) | 64-Bytes | B-3.pro | COMMAND FOR BYTE-MODE PROGRAMMING BY USE OF DATA OF 1-BUFFER SIZE BUFFERED IN DEVICE B (e.g., DATA OF 64-BYTE SIZE) |
| 6 | | Buffer Program Confirm(Word) | 32-Words | B-4.pro | COMMAND FOR WORD-MODE PROGRAMMING BY USE OF DATA OF 1-BUFFER SIZE BUFFERED IN DEVICE B (e.g., DATA OF 32-WORD SIZE) |
| 7 | C | Byte Program | 1-Byte | C-1.pro | COMMAND FOR PROGRAMMING 1 BYTE ONLY |
| 8 | | Word Program | 1-Word | C-2.pro | COMMAND FOR PROGRAMMING 1 WORD ONLY |
| 9 | | Buffer Program Confirm(Page) | 1-Page (64-Words) | C-3.pro | COMMAND FOR PROGRAMMING BY USE OF DATA OF 1-PAGE SIZE BUFFERED IN DEVICE C (e.g., DATA OF 64-WORD SIZE) |
| 10 | | Buffer Program Confirm(Sector) | 1-Sector (1024-Pages) | C-4.pro | COMMAND FOR PROGRAMMING BY USE OF DATA OF 1-SECTOR SIZE BUFFERED IN DEVICE C (e.g., DATA OF 1024-PAGE SIZE) |

APPARATUS FOR MEMORY CONTROL

CROSS-REFERENCE TO RELATED APPLICATIONS

The present application is based upon and claims the benefit of priority from the prior Japanese Patent Application No. 2018-154713 filed on Aug. 21, 2018, with the Japanese Patent Office, the entire contents of which are incorporated herein by reference.

FIELD

The disclosures herein relate to an apparatus for controlling memory write operations and a method of detecting a defect in a nonvolatile memory.

BACKGROUND

There are various types of nonvolatile memories including a flash memory, a ferroelectric random access memory, a magnetoresistive random access memory, etc. Flash memories are largely classified into a NAND type and a NOR type. The NAND type, for which the scale of integration is easily increased, is generally used for storage devices or the like such as an SSD (solid state drive) which requires a large memory capacity. The NOR type is used for storing BIOS (basic input output system), for storing logs, for storing FPGA (field programmable gate array) configuration data, etc.

In the case of an SSD employing the NAND type, the embedded SSD controller ensures reliability during operations. In contrast, the NOR type is mostly used alone. Although there is a type of memory device that is provided with an error correction function, a failure such as an inversion of logical values may occur during operations.

In flash memories, the length of write time varies greatly from memory cell to memory cell, due to variation in the size of control gates, variation in the concentration of impurities in source and drain regions, imperfection in the manufacturing of floating gates and insulating layers, etc. In consideration of this, the write voltage is adjusted on a write-unit-specific basis (i.e., on a bit-specific basis, on a word-specific basis, on a block-specific basis, or the like) during a final factory test to keep the length of write time within a specified range with respect to every memory device to be shipped.

For memory cells whose original manufacturing variation is small, no adjustment may be necessary because the length of write time lies within the specified range prior to any adjustment, or only a small-scale adjustment of the write voltage is needed to keep the length of write time within the specified range. For memory cells whose original manufacturing variation is intermediate, the write voltage may be adjusted to a fair degree to keep the length of write time within the specified range.

For memory cells whose original manufacturing variation is extremely large, it is impossible to adjust the write voltage to keep the length of write time within the specified range. Such memory cells are treated as defective cells. Addresses corresponding to the defective memory cells may be recovered by a redundancy process that utilizes backup memory cells as substitutes therefor. When recovery is not possible due to a large number of defective cells, the memory device as a whole is disposed of as a defective device.

An insulating layer, which is an element of a memory cell in a flash memory, undergoes degradation due to a high voltage applied during write operations and erase operations. Increasing degradation of an insulating layer causes the data retention property of the memory cell to deteriorate. As a result, the electric charge kept inside the floating gate may discharge with the passage of time, resulting in the retained data being lost.

Among the memory cells falling within the specified range, those memory cells existing in the write areas for which a voltage adjustment is made to increase a write voltage are subjected to a write voltage higher than an average write voltage each time a write operation is performed. As a result, such memory cells experience insulating layer degradation at faster speed than average memory cells. Especially in the write areas where the voltage is adjusted by a large amount, an applied write voltage is significantly higher than an average write voltage. Such areas thus have the problem that the data retention property is highly likely to suffer a problem in the long run.

As described above, some memory devices have memory cells for which the data retention property will suffer a problem in the long run. Even such memory devices are shipped from memory manufacturers as satisfactory products as long as the length of write time falls within the specified range for all the memory cells. The problem of data retention property in those memory devices comes to the surface during field use by end consumers, i.e., after the memory devices are embedded into products by an assembly manufacturer (i.e., the manufacturer who makes products by assembling purchased components such as memory devices for selling to end consumers). It is undesirable for the assembly manufacturer to use memory devices that are highly likely to present a problem in the long run, in products made available in the market.

RELATED-ART DOCUMENTS

Patent Document

[Patent Document 1] Japanese Laid-open Patent Publication No. 2001-13200

[Patent Document 2] Japanese Laid-open Patent Publication No. 2006-252361

SUMMARY

According to an aspect of the embodiment, an apparatus for memory control includes a data storage area configured to store data indicative of a distribution of total current consumption required for a write operation as measured with respect to one or more nonvolatile memory devices of a first type, and a control apparatus configured to evaluate, based on the data indicative of the distribution, a degree to which a total amount of current consumption required for a write operation with respect to a memory area in a nonvolatile memory device of the same first type, regarding a current flowing from a power supply to the nonvolatile memory device during the write operation, is deviated toward larger total current consumptions in the distribution, thereby determining whether the memory area is satisfactory.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 4 is a flowchart illustrating an example of the method of acquiring data indicative of a distribution of total current consumption;

FIG. 5 is a table illustrating a plurality of different types of memory devices and a plurality of write command types available for each device type;

DESCRIPTION OF EMBODIMENTS

In the following, embodiments of the invention will be described with reference to the accompanying drawings. In these drawings, the same or corresponding elements are referred to by the same or corresponding numerals, and a description thereof will be omitted as appropriate.

Figure 1:
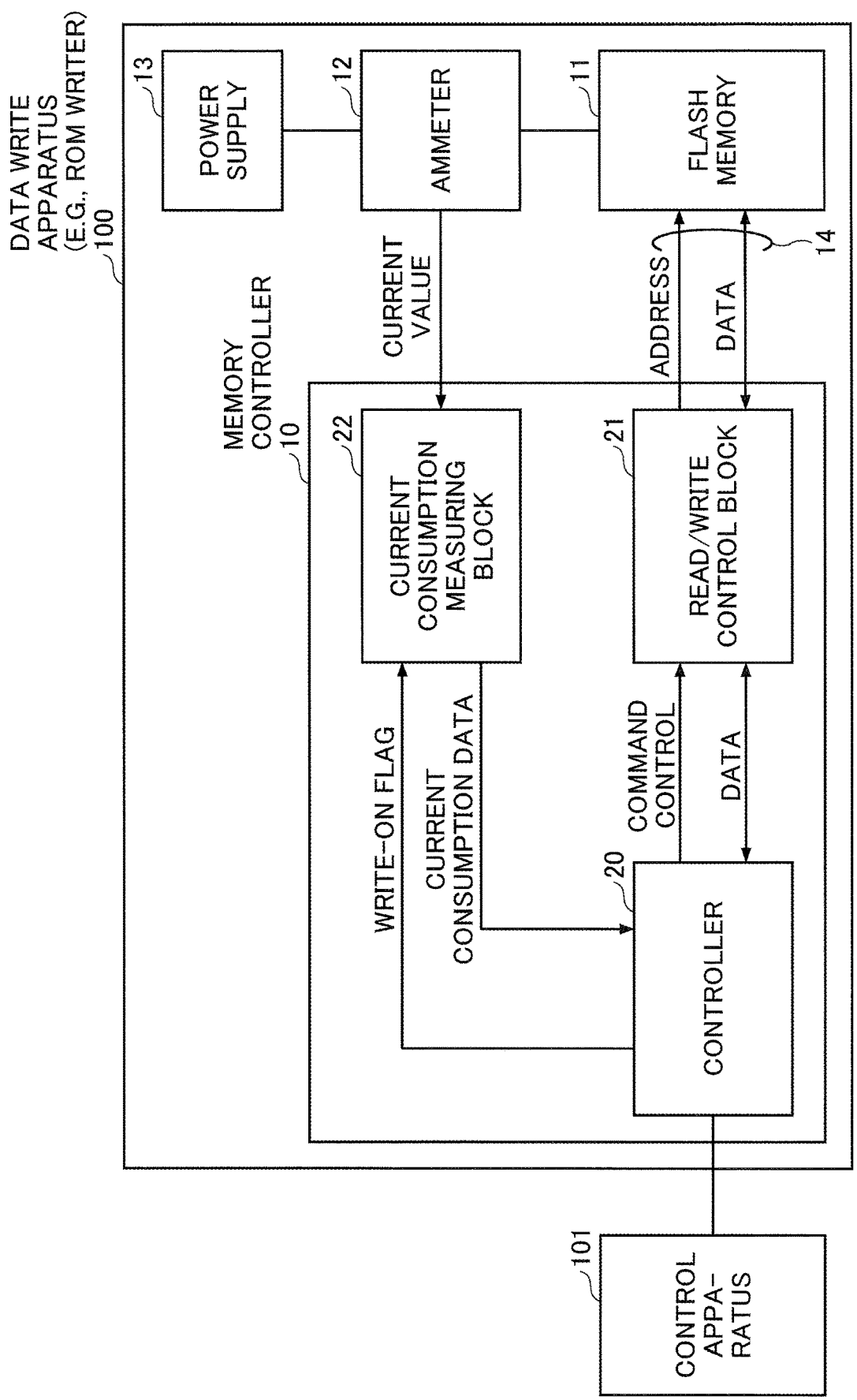
FIG. 1 is a drawing illustrating an example of the configuration of a write control apparatus.

FIG. 1 is a drawing illustrating an example of the configuration of a write control apparatus. In FIG. 1 and the subsequent similar drawings, boundaries between functional or circuit blocks illustrated as boxes basically indicate functional boundaries, and may not correspond to separation in terms of physical positions, separation in terms of electrical signals, separation in terms of control logic, etc. Each functional or circuit block may be a hardware module that is physically separated from other blocks to some extent, or may indicate a function in a hardware module in which this and other blocks are physically combined together.

The write control apparatus illustrated in FIG. 1 includes a data write apparatus 100 and a control apparatus 101. The data write apparatus 100, which may be a ROM writer, for example, includes a memory controller 10, an ammeter 12, and a power supply 13. The power supply 13 may be embedded in, or external to, the data write apparatus 100. Mounting a flash memory 11 to the data write apparatus 100 and controlling the data write apparatus 100 by use of the control apparatus 101 allows desired data to be written to the flash memory 11. The memory controller 10 is connected to the flash memory 11 via signal lines 14, which include address and command signal lines, data signal lines, ready/busy signal lines, etc.

The memory controller 10 supplies, to the flash memory 11, control signals such as a chip enable, an output enable, and a write enable. The memory controller 10 also supplies, to the flash memory 11, address signals indicating the address for which write or read operations are to be performed. The flash memory 11 operates in response to the control signals to write data to the specified address and to read data from the specified address. Data are exchanged between the memory controller 10 and the flash memory 11 via the data signal lines.

The unit of data that is written or read in a single data write operation or read operation is not limited to a specific number of bits or to a specific number of memory cells. Data may be read from or written to one memory cell, for example, or data may be read from or written to a plurality of memory cells corresponding to one word. Alternatively, data may be read from or written to a plurality of memory cells corresponding to one block.

The flash memory 11 transmits a ready/busy (RDY/BUSY) signal to the memory controller 10 via the ready/busy signal line. The ready/busy signal is a signal indicating whether the flash memory 11 is in a busy state due to an ongoing program operation or an ongoing erase operation, or is in a ready state allowing a next operation to be performed. The ready/busy signal assumes a first logical state (e.g., low level) to indicate that the flash memory 11 is busy, and assumes a second logical state (e.g., high level) to indicate that the flash memory 11 is ready. The memory controller 10 monitors the ready/busy signal on a ready/busy signal line 18 after sending a write instruction to the flash memory 11, thereby detecting the timing of the start and end of a write operation.

Alternatively, the memory controller 10 may detect the timing of the start and end of a write operation by checking the internal status registers of the flash memory 11, rather than monitoring the ready/busy signal. The status registers of the flash memory 11 include a bit indicative of whether a write operation is underway. This bit assumes a first logical state (e.g., low level) to indicate that the flash memory 11 is busy, and assumes a second logical state (e.g., high level) to indicate that the flash memory 11 is ready. The memory controller 10 may read and check the value of the status register at constant intervals after sending a write instruction to the flash memory 11, thereby detecting the timing of the start and end of a write operation. In the following description, the operation of the data write apparatus 100 will be described with reference to a case in which the ready/busy signal is monitored to detect the start and end of a write operation.

The memory controller 10 includes a controller 20, a read/write control block 21, and a current consumption measuring block 22. The controller 20 may be implemented entirely as hardware, or may be implemented as a processor operating based on software (e.g., firmware).

The controller 20 receives, from the control apparatus 101, control signals specifying a write command, a read command, etc. The controller 20 also receives, from the control apparatus 101, data signals indicative of write data for a write operation and address signals indicative of an address with respect to which a write operation or read operation is to be performed. The controller 20 decodes commands specified by the control signals, and controls the read/write control block 21 according to the decoding results. The controller 20 sends write data to the read/write control block 21, and receives read data from the read/write control block 21.

The controller 20 controls the current consumption measuring block 22 to measure the total amount of current consumption for a write operation, based on the output of the ammeter 12 during the write operation that is performed with respect to a memory area of the flash memory 11. The ammeter 12 may include, for example, a resistive element situated between the power supply 13 and the flash memory 11 and an AD converter that converts a voltage drop across the resistive element into a digital value, thereby outputting the digital value representing the value of current consumption regarding a current from the power supply 13 to the flash memory 11. The controller 20 may detect the timing of the start and end of a write operation in response to the ready/busy signal from the flash memory 11, and supplies to the current consumption measuring block 22 a write-on flag indicating that the write operation is in progress. The write-on flag may assume a first value during a write operation period, and may assume a second value during periods other than the write operation period.

The current consumption measuring block 22 may calculate the sum of current consumption values represented by the output digital values of the ammeter 12 at predetermined sampling intervals during a write operation period (i.e., the period from the start to the end of a write operation) indicated by the write-on flag. This sum corresponds to the integration of values of current consumption regarding a current flowing into the flash memory 11 over the write operation period. The finer the sampling interval, the more accurate the integrated value of current consumption is. Nevertheless, the sampling interval is not limited to any particular interval. The current consumption measuring block 22 may calculate the total amount of current consumption for a write operation through the above-noted integrating operation, followed by supplying current consumption data indicative of the total amount of current consumption to the controller 20.

Figure 2:
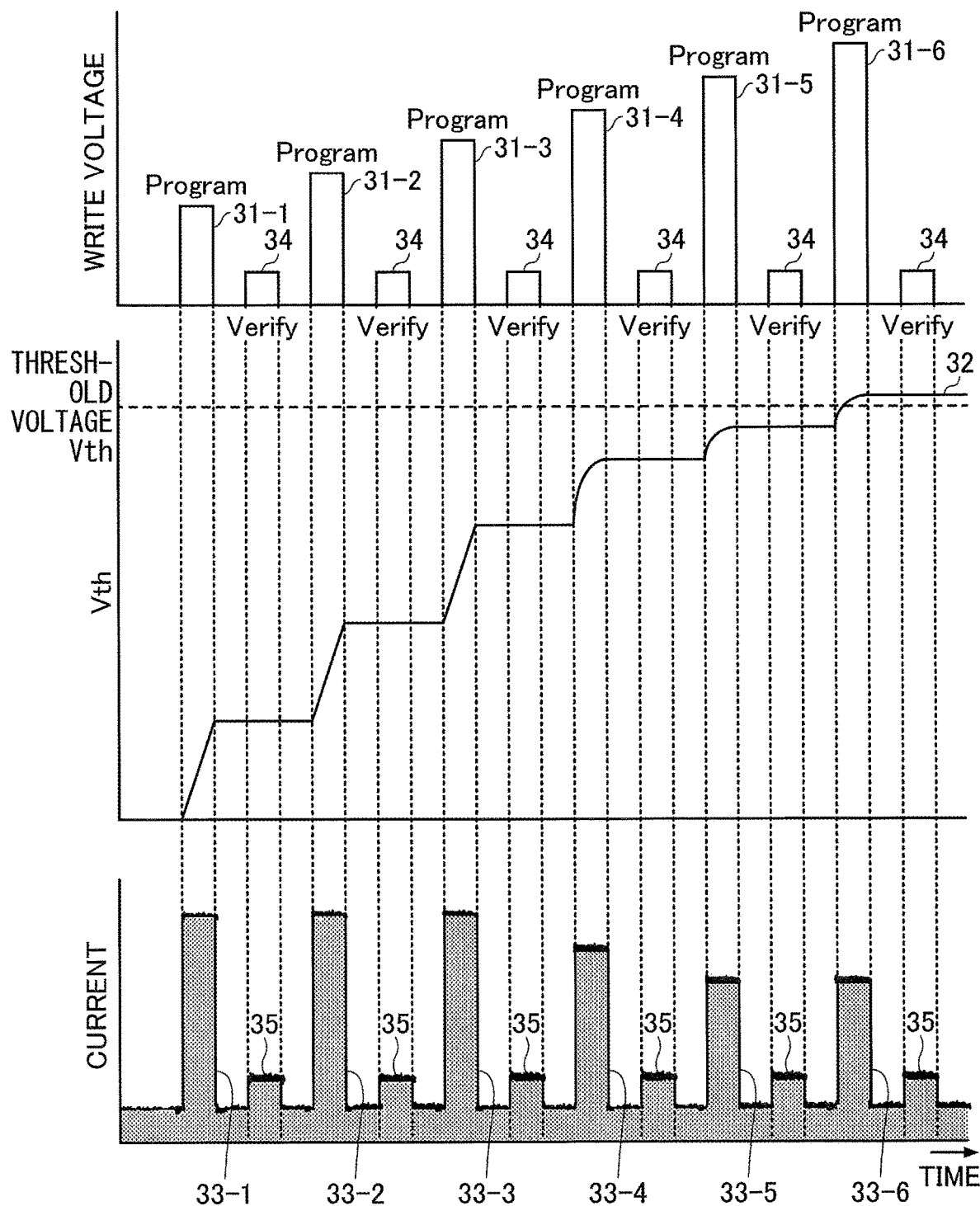
FIG. 2 is a drawing illustrating changes in the current flowing into a memory cell during a write operation and changes in the threshold value of a memory cell.

FIG. 2 is a drawing illustrating changes in the current flowing into a memory cell during a write operation and changes in the threshold value of a memory cell. When a write (i.e., program) operation is performed with respect to a memory cell, a program voltage is applied to the gate, and half the program voltage is applied to the drain, with the source being set to the ground potential. Alternatively, the program voltage is applied to the gate, and the drain and source are set to the ground potential. These voltage settings cause electrons to be injected into the floating gate of the memory cell, thereby increasing the threshold voltage of the memory cell.

In FIG. 2, a program voltage 31-1 is applied, so that the first write operation (i.e., injection of electrons into the floating gate) is performed with respect to a memory cell of interest. This write operation causes the threshold voltage of the memory cell to increase as illustrated in a voltage curve 32. However, a single write operation does not bring about a sufficient increase, so that the threshold voltage value is still lower than a reference threshold voltage Vth. In the verify operation performed after the write operation, a verify voltage 34 (=Vth) is applied to the gate of the memory cell to check whether current flows between the drain and the source. After only one write operation, a current flows between the drain and the source, so that the write operation is considered to be incomplete.

Program voltages 31-2 through 31-6 are then applied with gradual increases in the voltage level to perform the second to sixth write operations and associated verify operations. With these multiple write operations, the threshold voltage of the memory cell increases as illustrated in the voltage curve 32, and exhibits a sufficient increase to exceed the reference threshold voltage Vth after the completion of the sixth write operation. In the verify operation performed after the sixth write operation, no current flows between the drain and the source, so that the write operation is considered to be completed.

With the first through sixth write operations and verify operations described above, a write operation responsive to a single write command comes to an end. The size of a memory area with respect to which a write operation is performed in response to a single write command is specific to each command. Different write commands are provided with respect to memory areas of different sizes such as one bit area, one byte area, one word area, one page area, one sector area, etc. The above-noted write operations and verify operations are performed on a write-unit-specific basis. Also, as described above, the size of a write voltage is adjusted for each write unit so that the length of write time is shorter than or equal to a predetermined time length. Namely, when the length of write time involving more than six write operations will exceed the specified time length, for example, the levels of the program voltages 30-1 through 31-6 are increased to complete the whole operation with six or fewer write operations.

Figure 12:
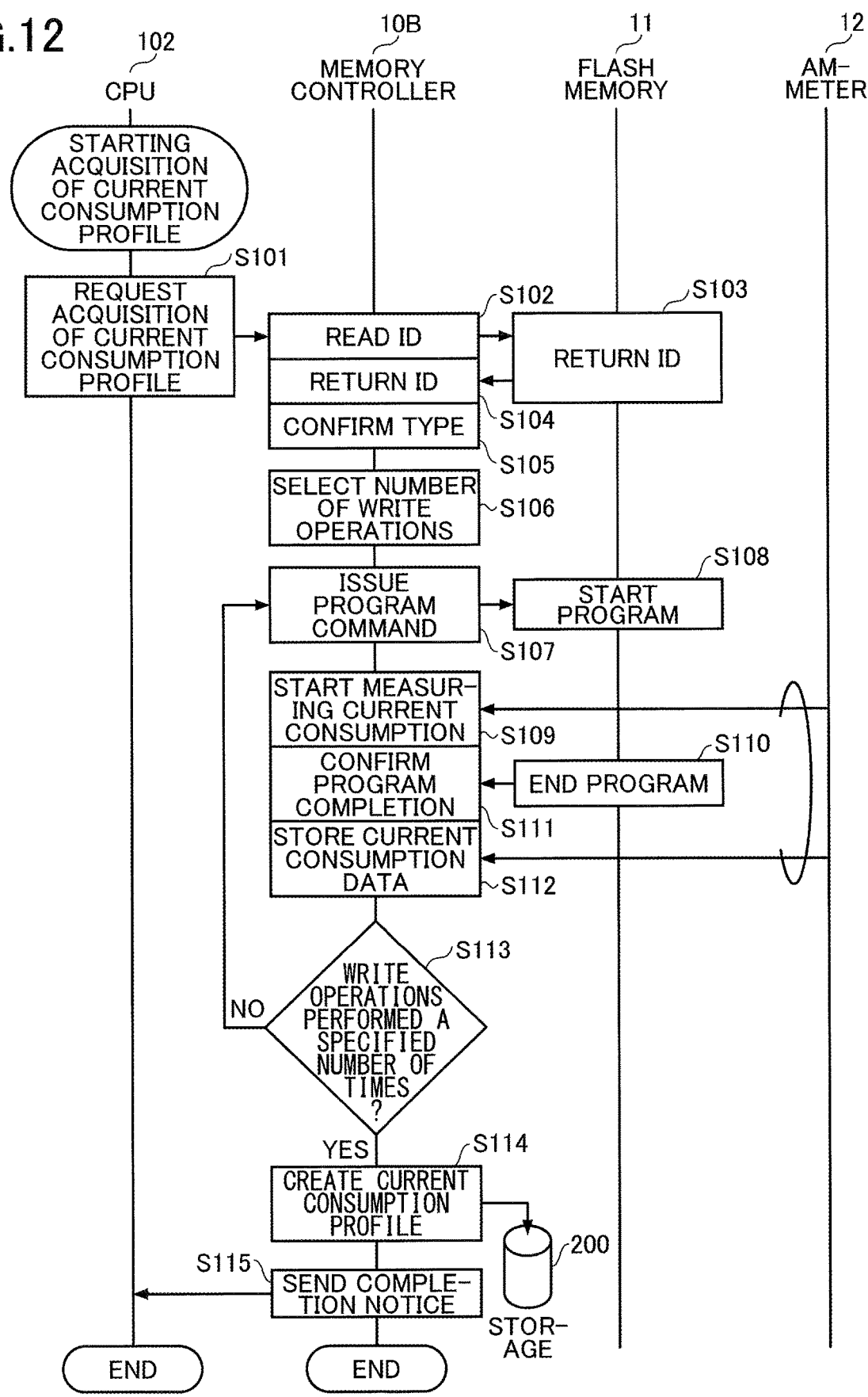
FIG. 12 is a flowchart illustrating an example of the method of acquiring data indicative of a distribution of total current consumption as performed by the write control apparatus illustrated in FIG. 11.

Current consumption regarding the currents flowing into the flash memory 11 during the write operations responsive to one write command is illustrated in the bottom of FIG. 12. Currents 33-1 through 33-6 flow in response to the applied program voltages 31-1 through 31-6, respectively, and currents 35 flow in response to verify voltages 34. In addition, a small amount of current is constantly flowing as background current (i.e., leakage current, etc.).

The current consumption measuring block 22 illustrated in FIG. 1 may integrate the current consumption values (i.e., the values of currents illustrated in the bottom of FIG. 2) represented by the output digital values of the ammeter 12 at predetermined sampling intervals between the start and the end of a write operation responsive to a single write command. The result of integration is the total current consumption for the write operation. The sampling interval is at least such an interval that the currents 33-1 through 33-6 and the currents 35 are sampled and detected, and is preferably an interval sufficiently shorter than the pulse width of the currents 33-1 through 33-6 and the currents 35.

With the above-noted operation, the controller 20 of the memory controller 10 is able to measure the total amount of current consumption for a write operation performed with respect to a specified memory area. The higher the write voltage and the longer the write voltage is applied, the greater the deterioration of the insulating layer of the memory cell due to the write operation. The total amount of current consumption measured as described above serves as an indicator of the degree of deterioration that occurs in the insulating layer each time a write command is executed.

The memory controller 10 may send the data indicative of measured total current consumption to the control apparatus 101. The control apparatus 101 may store the received data indicative of total current consumption in a data storage area (i.e., a data storage 200 illustrated in FIGS. 4, 7, 9, 10, 12, 13, and the like) such as a memory device or a hard-disk drive. Alternatively, the memory controller 10 of the data write apparatus 100 may be provided with a sufficient data storage area as registers or the like, and the data indicative of total current consumption may be stored in such a data storage area. In the following, a description will be given with respect to an example in which the data indicative of total current consumption is stored in the data storage area of the control apparatus 101.

The data indicative of total current consumption stored in the data storage area of the control apparatus 101 may include different total current consumption values measured for different types of memory devices. Namely, the stored data may include different current consumption values for different types of memory devices, such as a first total current consumption value for a first-type memory device, a second total current consumption value for a second-type memory device, and the like. Further, the data indicative of total current consumption for a memory device of a certain type may include different total current consumption values measured for different types of write commands (e.g., a byte-specific write command, a word-specific write command, etc.) provided for the memory device of such a type. Namely, the stored data may include different current consumption values for different write commands, such as a first total current consumption value for a first write command, a second total current consumption value for a second write command, and the like.

Further, the data indicative of a total current consumption value for a particular write command with respect to a particular type of memory device may be data indicative of the distribution of total current consumption obtained by executing the write command with respect to a plurality of different write areas in this type of memory device.

Here, the distribution of total current consumption may be a frequency distribution represented by a histogram in which the respective numbers of memory cells (or memory-write units) requiring different total current consumption values are indicated with respect to the total current consumption values on the horizontal axis. The data indicative of a total current consumption value may be the entire set of histogram data themselves, or may be the value of the distribution center and the value indicative of a spread of the distribution (e.g., the standard deviation, the maximum value and the minimum value, or the like), which serve as the data indicative of the distribution of total current consumption. Alternatively, the data indicative of a total current consumption value may be data indicating the maximum allowable value of total current consumption from the viewpoint of the degradation of data retention characteristics.

The data indicative of total current consumption stored in the data storage area of the control apparatus 101 may be collected by using the data write apparatus 100 to execute various write commands with respect to various types of memory devices. Alternatively, the data may be collected in advance by using another write apparatus having the function to measure current consumption in a similar manner to the data write apparatus 100. Such data indicative of total current consumption may be collected by the assembly manufacturer in advance or by other vendors.

When placing a memory device in a product, the assembly manufacturer may measure total current consumption values with respect to this memory device (i.e., the flash memory 11). Namely, the assembly manufacturer may measure total current consumption values for data write operations performed with respect to the flash memory 11 (i.e., the memory device of a certain type) as described above by using the control apparatus 101 and the data write apparatus 100. Based on the data (i.e., the data indicative of total current consumption stored in the data storage area), the control apparatus 101 may evaluate the degree to which the total current consumption value measured for a write operation is deviated toward the larger values of total current consumption in the distribution described above, thereby determining whether the memory area is problem-free. As the degree to which the total current consumption value measured for a memory area deviates from the center of the distribution to the right (i.e., toward larger total current consumptions) increases, the speed at which the data retention characteristics in the memory area degrade may increase. For example, when the total current consumption value measured for a memory area is deviated to a large degree from the center of the distribution toward the maximum value, the degradation of the data retention characteristics of this memory area is considered to be very fast. In contrast, when the total current consumption value measured for a memory area is deviated to a moderate degree from the center of the distribution toward the maximum value, the degradation of the data retention characteristics of this memory area is considered to be faster than the average but to present no serious problem.

The data indicative of a total current consumption value stored in the data storage area may be data indicating the maximum allowable value of total current consumption from the viewpoint of the degradation of data retention characteristics. In this case, the control apparatus 101 may determine that a memory area is defective when the total current consumption value measured for a write operation performed with respect to this memory area is larger than the maximum allowable value of total current consumption. Making a determination based on the data indicative of the maximum allowable value enables the efficient use of a memory area, and also allows the result of determination to be obtained through a simple comparison arithmetic.

The term "defective" used in the above context does not mean that the write area is unusable as a memory element. Such a write area has the minimum necessary function to retain the written data. However, the speed at which the data retention characteristics deteriorate is a problem. Due to the fact that the data may be lost after the passage of a long time period, the write area of interest is regarded as being defective.

As previously described, the total current consumption value for a data write operation performed with respect to the flash memory 11 may be measured when the assembly manufacturer uses the data write apparatus 100 illustrated in FIG. 1 to write data upon assembling a product with the flash memory 11. For example, if the flash memory 11 is for storing a BIOS, the total current consumption value may be measured when the BIOS is actually stored. For example, if the flash memory 11 is for storing logs, the total current consumption value may be measured when logs are actually recorded. If the flash memory 11 is for storing FPGA configuration data, the total current consumption value may be measured when the configuration data is actually stored.

After the memory area for storing actual written data is determined to be defective, the controller 20 may control subsequent write operations so as not to use the address of this memory area. Alternatively, the memory device (i.e., the flash memory 11 for which an attempt is made to write the actual data) may be considered to be defective and unsuitable for storing actual data, thereby being replaced with another memory device of the same type.

Controlling subsequent write operations to avoid using the address of a defective memory area as described above is effective in applications where the memory capacity is sufficiently large or where stored data may be deleted at appropriate timing. For example, when the flash memory 11 is used for storing log information, the memory capacity may eventually become full of stored log information. The oldest log information is then deleted, and new log information may be stored. In such a case, setting aside part of the addresses of the flash memory 11 as unusable areas does not cause much of a trouble. Controlling subsequent write operations to avoid using the addresses of defective memory areas reduces the possibility of the memory device being discarded as a defective product, thereby enabling the economic use of memory devices.

Figure 3:
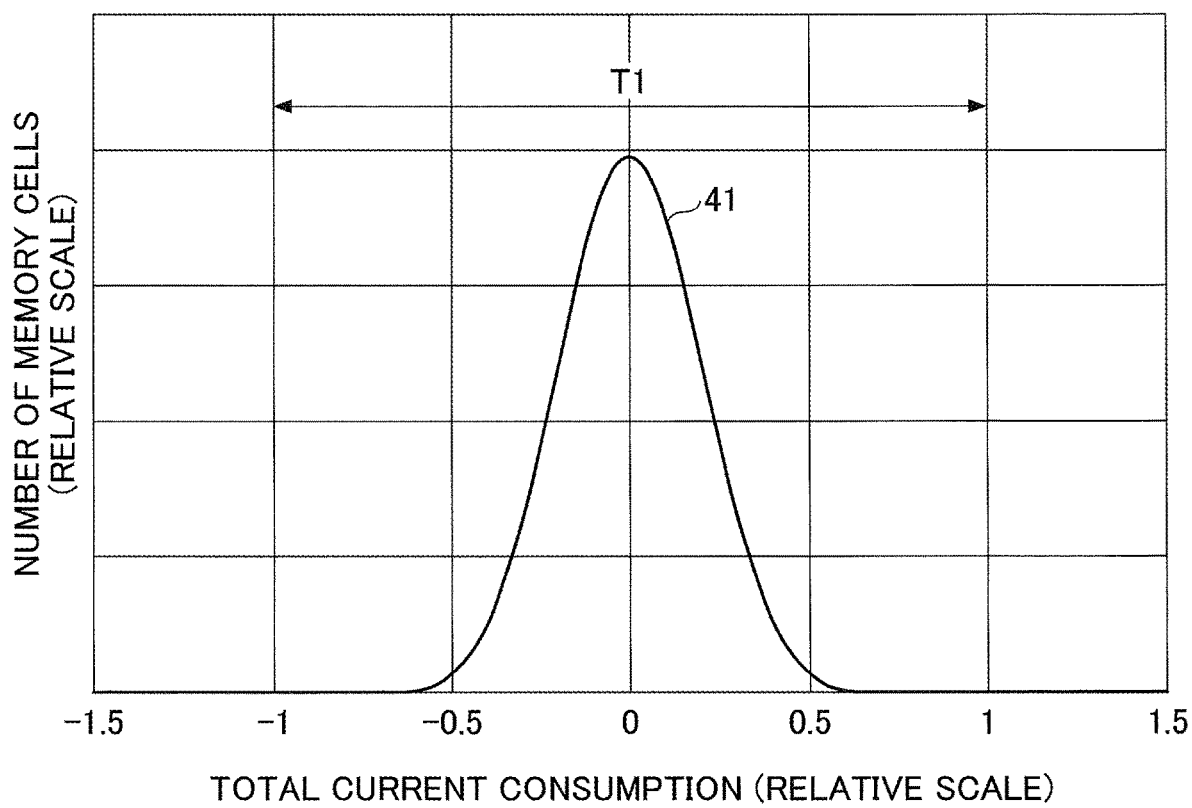
FIG. 3 is a drawing illustrating an example of the distribution of total current consumption.

FIG. 3 is a drawing illustrating an example of the distribution of total current consumption. In FIG. 3, the horizontal axis represents total current consumption indicated in relative values (i.e., values normalized to a standard range), and the vertical axis represents the frequency of occurrences of respective total current consumption values. A distribution profile illustrated in FIG. 3 is an example of the distribution of total current consumption measured for a particular write command executed with respect to a memory device of a particular type.

Write operations may be performed upon the write command with respect to all the addresses of a memory device of such a particular type, for example. Total current consumption values for the write operations may then be measured in the manner previously described, thereby producing a histogram representing the frequency of occurrences of total current consumption values. The envelope of the histogram (i.e., the line connecting the frequency of occurrences of total current consumption values) forms the distribution profile 41. Creating such a distribution of total current consumption in advance for a certain write command with respect to a memory device of a certain type allows the variability of total current consumption values to be identified for such a write command with respect to the memory device of such a type.

It may be noted that erase operations may be performed after write operations thereby to allow the write operations to be performed the second time for all the addresses, which allows the write operations directed to all the addresses to be repeated multiple times. A histogram may be created by accumulating total current consumption values obtained from these multiple measurements. A histogram may alternatively be created by measuring total current consumption values only for some but not all of the addresses.

In order to determine the distribution of total current consumption, a plurality of memory devices of the particular type may preferably be used to measure total current consumption values for these memory devices of the same type. A histogram may be created by accumulating total current consumption values obtained from these memory devices. Measuring total current consumption values for a plurality of memory devices of the same type allows accuracy to be improved, compared with the case in which total current consumption values are measured for only one memory device. Also, this arrangement serves to absorb differences in the characteristics caused by differences in the manufacturing lot.

Based on the distribution of total current consumption indicated by the distribution profile 41, an upper limit of allowable total current consumption values, i.e., the maximum allowable value of total current consumption, may be determined, for example. The total current consumption values that constitute the distribution profile 41 illustrated in FIG. 3 fall within the range T1. Among the total current consumption values included in this range T1, the memory area for which the measured total current consumption values are greater than or equal to a threshold value of 0.5 may be considered to be a defective memory area with the possibility of a large degradation in the future. After the memory area for storing actual written data is determined to be defective, the controller 20 may control subsequent write operations so as not to use the address of this memory cell. In so doing, the position of the threshold (i.e., the position of the upper limit of the allowable range) may be determined based on both the spread of the distribution profile 41 of the memory device and the field of use of the memory device.

As for the effect of the field of use, the maximum allowable value of total current consumption may vary depending on the field of use even for the same type of non-volatile memory devices. A write command X for a memory device of a type A may have a distribution of total current consumption as indicated by the distribution profile 41. When the write command X for a memory device of this type A is used in applications where high data retention characteristics are required, the threshold may be set at the position that provides a narrow allowable range. Namely, the upper limit threshold value may be set to 0.4, for example. When the write command X for a memory device of this type A is used in applications where high data retention characteristics are not required, the threshold may be set at the position that provides a wide allowable range. Namely, the upper limit threshold value may be set to 0.9, for example. Setting the position of an allowable range according to the field of use enables proper quality control according to the field of use.

FIG. 4 is a flowchart illustrating an example of the method of acquiring data indicative of a distribution of total current consumption. The procedure of the flowchart illustrated in FIG. 4 is performed by the data write apparatus 100 and the control apparatus 101 illustrated in FIG. 1.

In FIG. 4 and the subsequent flowcharts, an order in which the steps illustrated in the flowchart are performed is only an example. The scope of the disclosed technology is not limited to the disclosed order. For example, a description may explain that an A step is performed before a B step is performed. Despite such a description, it may be physically and logically possible to perform the B step before the A step while it is possible to perform the A step before the B step. In such a case, all the consequences that affect the outcomes of the flowchart may be the same regardless of which step is performed first. It then follows that, for the purposes of the disclosed technology, it is apparent that the B step can be performed before the A step is performed. Despite the explanation that the A step is performed before the B step, such a description is not intended to place the obvious case as described above outside the scope of the disclosed technology. Such an obvious case inevitably falls within the scope of the technology intended by this disclosure.

In step S1 of FIG. 4, the control apparatus 101 checks the type of the memory device to be measured. When the distribution of total current consumption for a memory device of type A needs to be measured, a check is made as to whether the memory device to be measured is of this type. Specifically, the control apparatus 101 sends a type check request to the memory controller 10 of the data write apparatus 100 to check the type of the flash memory 11.

In step S2, the memory controller 10 of the data write apparatus 100 responds to the type check request by sending a command to the flash memory 11 for reading an identifier indicative of the type. In step S3, the flash memory 11 sends identifier data in response to the read command. In step S4, the memory controller 10 receives the identifier data from the flash memory 11, and sends the received identifier data to the control apparatus 101.

In step S5, the control apparatus 101 selects the number of write operations to be performed with respect to the flash memory 11. As was previously described, repeating write operations and erase operations to perform multiple sets of write operations allows more accurate distribution data to be collected.

In step S6, the control apparatus 101 issues a write control command to the memory controller 10 of the data write apparatus 100. Specifically, the control apparatus 101 selects, one after another, a plurality of types of write commands available for a memory device of the confirmed type, followed by sending to the data write apparatus 100 a write instruction for executing the selected write command and an instruction indicative of the number of times the write command is to be executed.

FIG. 5 is a table illustrating a plurality of different types of memory devices and a plurality of write command types available for each device type. In the table illustrated in FIG. 5, three different types, i.e., device type "A", device type "B", and device type "C", are listed as table entries in the column "DEVICE TYPE". The "COMMAND" column lists a plurality of types of write commands available for each type of memory device. In the case of the type-C memory device, for example, the available program commands include a byte-specific program command, a word-specific program command, a page-specific program command, and a sector-specific program command. In the case of the page-specific program command or the sector-specific program command, write data will be the data stored in a page-size buffer or a sector-size buffer embedded in the memory device.

Figure 6:
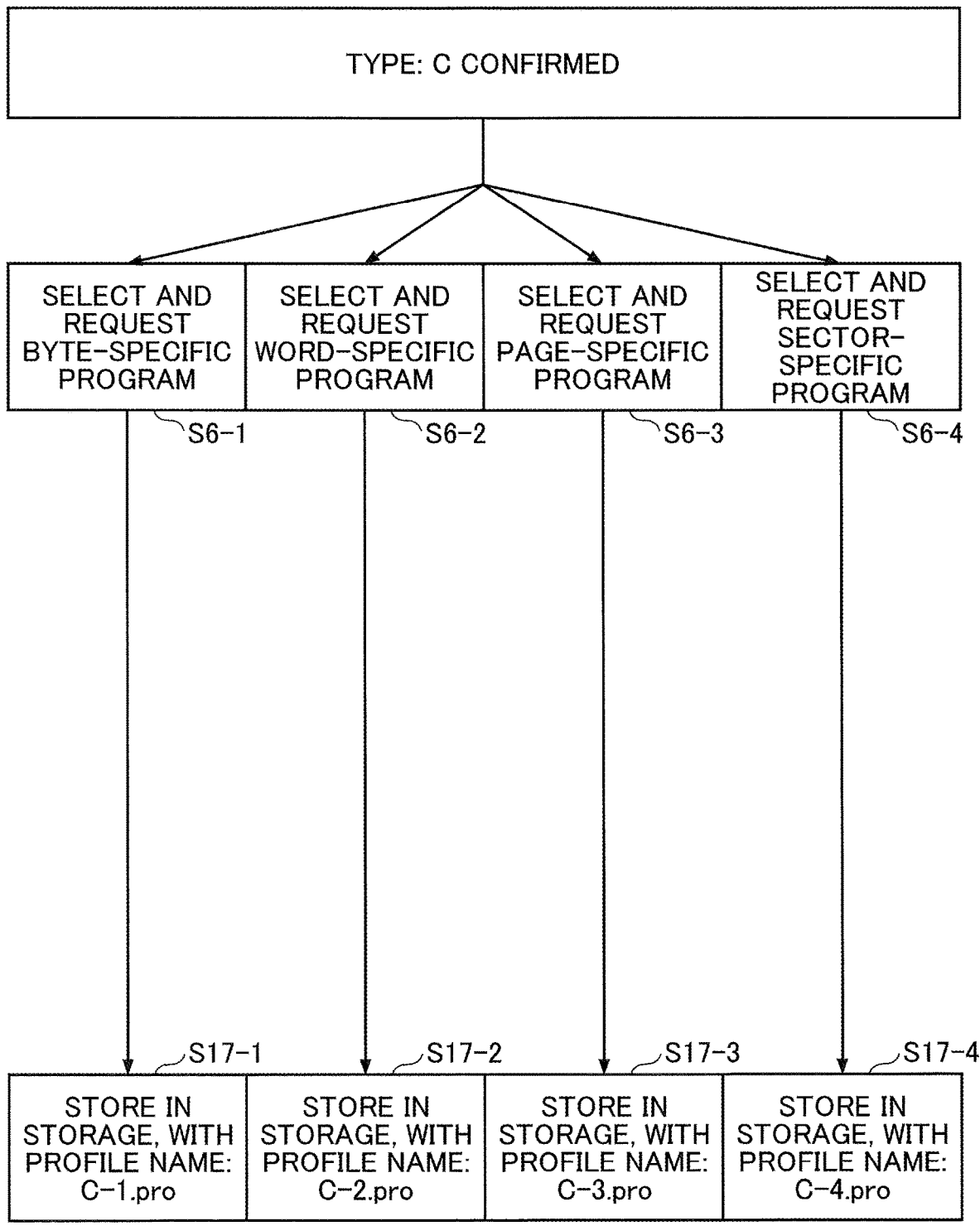
FIG. 6 is a drawing illustrating a process performed by a data write apparatus when a plurality of write command types are provided.

FIG. 6 is a drawing illustrating a process performed by the data write apparatus 100 when a plurality of write command types are provided. As illustrated in FIG. 6, upon confirming that the type of the memory device to be subjected to write operations is of the type C, for example, the plurality of types of write commands are selected one after another to issue a corresponding write instruction in steps S6-1 through S6-4, which are the sub-steps of step S6 illustrated in FIG. 4. Specifically, the control apparatus 101 selects a byte-specific program command and issues a write instruction in step S6-1. Further, the control apparatus 101 selects a word-specific program command and issues a write instruction in step S6-2. Also, the control apparatus 101 selects a page-specific program command and issues a write instruction in step S6-3. Moreover, the control apparatus 101 selects a sector-specific program command and issues a write instruction in step S6-4. More specifically, the issuance of one write instruction for one type of write command causes the processes of steps S7 through S17 illustrated in FIG. 4 to be performed. After these processes are completed, a write instruction for the next type of write command is issued.

Returning to FIG. 4, in step S7, the memory controller 10 issues a write command (i.e., program command) to the flash memory 11. In step S8, the flash memory 11 starts a write operation (i.e., program operation). This write operation corresponds to the execution of a single write command with respect to a memory area of a specified write unit (byte, word, etc.) to which the issued write command is directed.

In step S9, the memory controller 10 starts measuring current consumption. Specifically, the process started here involve detecting the output value of the ammeter 12 (i.e., a digital value indicative of current) at predetermined sampling intervals and calculating the sum of detected values. Calculation of the sum may be performed concurrently with the detection of each sampled value, or may be performed after the detection of all the sampled values is completed.

In step S10, the flash memory 11 completes the write operation. In step S11, the memory controller 10, which is monitoring the ready/busy signal, for example, detects that the write operation of the flash memory 11 is completed. In step S12, the memory controller 10 stops measuring current consumption in response to the completion of the write operation. In step S13, the memory controller 10 notifies the control apparatus 101 of the total amount of current consumption (i.e., total current consumption value) for the write operation.

In step S14, the control apparatus 101 temporarily stores the notified total current consumption value in the internal register. In step S15, the memory controller 10 determines whether a write command has been executed a specified number of times. When the write command has not been executed the specified number of times, the memory controller 10 repeats the process of step S7 and the subsequent processes. When the write command has already been executed the specified number of times, in step S16, the memory controller 10 sends a write completion notice to the control apparatus 101.

In step S17, the control apparatus 101 creates a distribution profile based on a plurality of measured total current consumption values in response to the write completion notification. Namely, a histogram indicating the frequency of occurrences of total current consumption values is created, and the envelope of the histogram (i.e., a line connecting the frequencies of total current consumption values) is created as a distribution profile. In the case of digital data, the histogram data themselves may be regarded as a distribution profile. The control apparatus 101 further stores data indicative of the distribution of total current consumption in a data storage area such as the data storage 200. The data to be stored may be histogram data representing the distribution of total current consumption, profile data representing the envelope, data reflecting the distribution (i.e., a center value, a standard deviation, a maximum allowable value, etc.), or a combination thereof.

A file name for storing the data indicative of the distribution in step S17 may be such a file name as selected for each of the plurality of types of write commands previously described. Specifically, when the data indicative of a distribution of total current consumption with respect to a byte-specific write command is stored, the data indicative of a distribution is stored by use of a file name "C-1pro" in step S17-1 as illustrated in FIG. 6. Similarly, for a word-specific write command, a page-specific write command, and a sector-specific write command, the data indicative of a distribution is stored by use of file names "C-2pro", "C-3pro", and "C-4pro" in steps S17-2, S17-3, and S17-4, respectively.

With the above-noted process, the procedure for acquiring data indicative of a distribution of total current consumption comes to an end.

Figure 7:
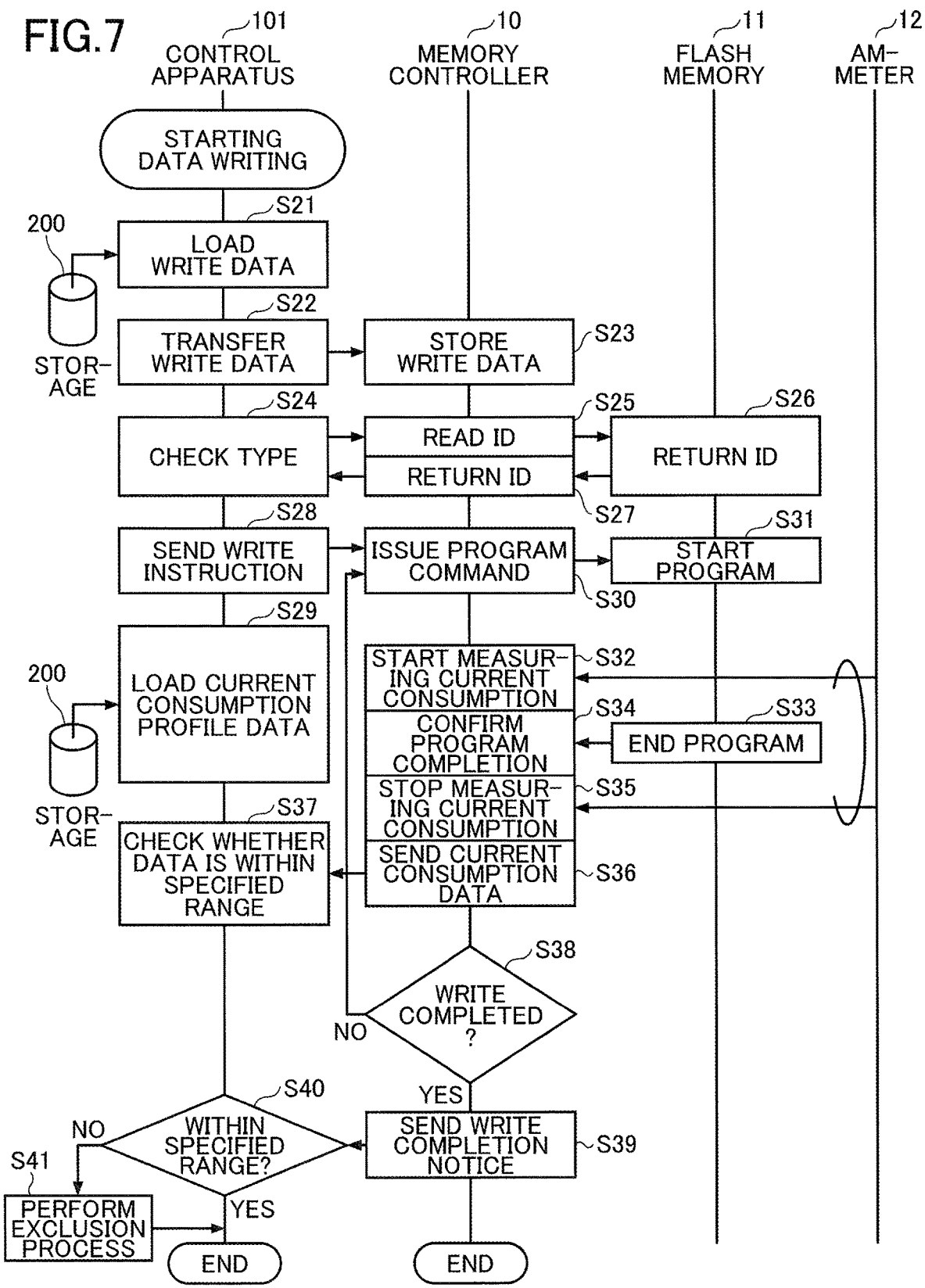
FIG. 7 is a flowchart illustrating an example of the method of determining whether a memory device is satisfactory or defective upon writing actual data.

FIG. 7 is a flowchart illustrating an example of the method of determining whether a memory device is satisfactory or defective upon writing actual data. The procedure of the flowchart illustrated in FIG. 6 is performed by the data write apparatus 100 and the control apparatus 101 illustrated in FIG. 1 when actual data are written.

In step S21, the control apparatus 101 loads write data from the data storage 200 or the like. This write data is to be written to the flash memory 11 that is to be incorporated in the product. In step S22, the control apparatus 101 sends the write data to the data write apparatus 100. In step S23, the data write apparatus 100 receives the write data, and stores the received write data in the internal memory area, register, or the like.

In step S24, the control apparatus 101 checks the type of a memory device subjected to a write operation. Specifically, the control apparatus 101 sends a type check request to the memory controller 10 of the data write apparatus 100 to check the type of the flash memory 11.

In step S25, the memory controller 10 of the data write apparatus 100 responds to the type check request by sending a command to the flash memory 11 for reading an identifier indicative of the type. In step S26, the flash memory 11 sends identifier data in response to the read command. In step S27, the memory controller 10 receives the identifier data from the flash memory 11, and sends the received identifier data to the control apparatus 101.

In step S28, the control apparatus 101 issues a write control instruction to the memory controller 10 of the data write apparatus 100. Specifically, the control apparatus 101 selects a write command among the plurality of types of write commands available for the memory device having the type confirmed in step S24, followed by sending a write instruction for executing the selected write command to the data write apparatus 100.

In step S29, the control apparatus 101 reads from the data storage 200 the profile data of total current consumption, which is to be used to determine whether a memory area is satisfactory or defective. Specifically, the control apparatus 101 reads from the data storage the data having a file name corresponding to the write command type that is selected in step S28 among the plurality of types of write commands, which are available for the memory device that has the type confirmed in step S24. The data of this file name is the data stored in step S17 of FIG. 4 (i.e., steps S17-1 through S17-4 of FIG. 6).

In step S30, the controller 20 issues a write command (i.e., program command) to the flash memory 11. In step S31, the flash memory 11 starts a write operation (i.e., program operation). This write operation corresponds to the execution of a single write command with respect to a memory area of a specified write unit (byte, word, etc.) to which the issued write command is directed.

In step S32, the memory controller 10 starts measuring current consumption. Specifically, the process started here involve detecting the output value of the ammeter 12 (i.e., a digital value indicative of current) at predetermined sampling intervals and calculating the sum of detected values. Calculation of the sum may be performed concurrently with the detection of each sampled value, or may be performed after the detection of all the sampled values is completed.

In step S33, the flash memory 11 completes the write operation. In step S11, the memory controller 10, which is monitoring the ready/busy signal, for example, detects that the write operation of the flash memory 11 is completed. In step S35, the memory controller 10 stops measuring current consumption in response to the completion of the write operation. In step S36, the memory controller 10 notifies the control apparatus 101 of the total amount of current consumption (i.e., total current consumption value) for the write operation.

In step S37, the control apparatus 101 determines whether the notified total current consumption value is within an acceptable range based on the data indicative of a distribution. More specifically, a check may be made as to whether the notified total current consumption value is greater than the maximum allowable value of total current consumption.

In step S38, the memory controller 10 determines whether the write command for the specified write data is completed, thereby determining whether the write operation is completed. The write data received and stored in step S23 may be 300 words, and a word-specific write command may be used, for example. In such a case, a check is made as to whether write operations are performed 300 times. When the write operation is not completed, the memory controller 10 repeats the process of step S30 and the subsequent processes. When the write operation is completed, the memory controller 10 in step S39 sends a write completion notice to the control apparatus 101.

In step S40, in response to the write completion notice, the control apparatus 101 determines whether the total current consumption values for the memory device or the memory area of interest are within the specified acceptable range according to the determination made in step S37. When the value does not fall within the specified range, the control apparatus 101 in step S41 performs an exclusion process. Specifically, the control apparatus 101 may output the result of determination indicating that the memory device or memory area of interest is defective. The term "output" means, for example, that the result of determination may be stored in a data storage, may be indicated on a display screen, or transmitted to the outside as a notice. The result of determination may specify only the memory device, or may further specify the identified defective memory area in addition to the memory device. The user who receives such a determination result may know that the data retention characteristics of the memory device or the memory area are likely to deteriorate rapidly in the future thereby to become a problem.

With the above-noted process, the procedure for determining whether the memory device is satisfactory or defective upon writing actual data comes to an end.

Figure 8:
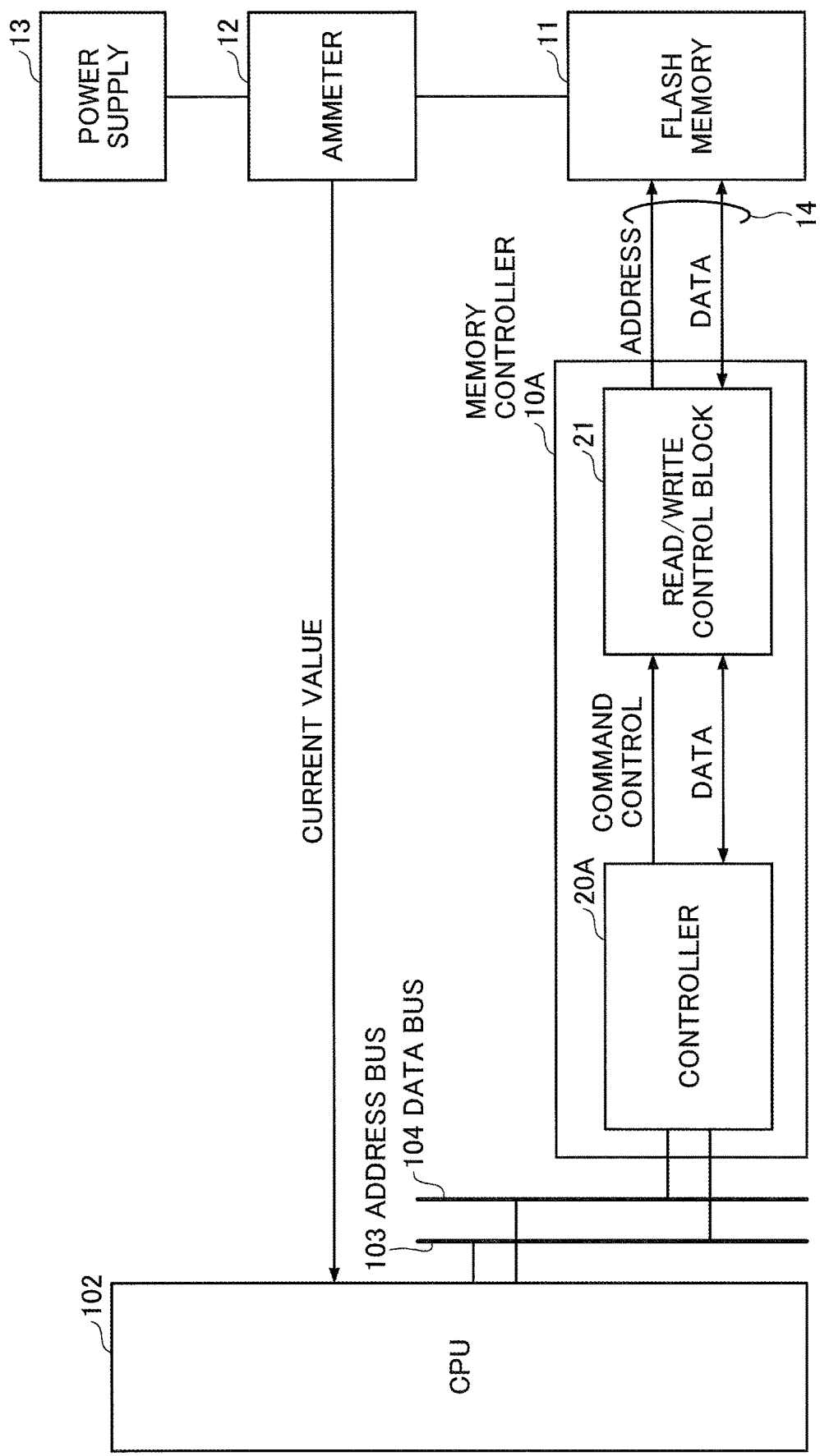
FIG. 8 is a drawing illustrating another example of the configuration of a write control apparatus.

FIG. 8 is a drawing illustrating another example of the configuration of a write control apparatus. The write control apparatus illustrated in FIG. 8 includes a CPU (central processing unit) 102, an address bus 103, a data bus 104, a memory controller 10A, a flash memory 11, a ammeter 12, and a power supply 13. The write control apparatus may be, for example, a computer or the like. The power supply 13 may be embedded in, or external to, the write control apparatus. The flash memory 11, to which data is written, may be a memory unit that is fixedly embedded in the write control apparatus, or an exchangeable memory unit.

The CPU 102 controls the memory controller 10A to write data to the flash memory 11. The memory controller 10A is connected to the flash memory 11 via signal lines 14, which include address and command signal lines, data signal lines, ready/busy signal lines, etc.

The memory controller 10A supplies, to the flash memory 11, control signals such as a chip enable, an output enable, and a write enable. The memory controller 10A also supplies, to the flash memory 11, address signals indicating the address for which write or read operations are to be performed. The flash memory 11 operates in response to the control signals to write data to the specified address and to read data from the specified address. Data are exchanged between the memory controller 10A and the flash memory 11 via the data signal lines.

The memory controller 10A includes a controller 20A and a read/write control block 21. The controller 20A receives, from the CPU 102, control signals specifying a write command, a read command, etc. The controller 20A also receives, from the CPU 102, data signals indicative of write data for a write operation and address signals indicative of an address with respect to which a write operation or read operation is to be performed. The controller 20A decodes commands specified by the control signals, and controls the read/write control block 21 according to the decoding results. The controller 20A sends write data to the read/write control block 21, and receives read data from the read/write control block 21.

The CPU 102 measures the total amount of current consumption (i.e., a total current consumption value) for a write operation based on the output of the ammeter 12. The ammeter 12 may include, for example, a resistive element situated between the power supply 13 and the flash memory 11 and an AD converter that converts a voltage drop across the resistive element into a digital value, thereby outputting the digital value representing the value of current consumption regarding a current from the power supply 13 to the flash memory 11.

Figure 9:
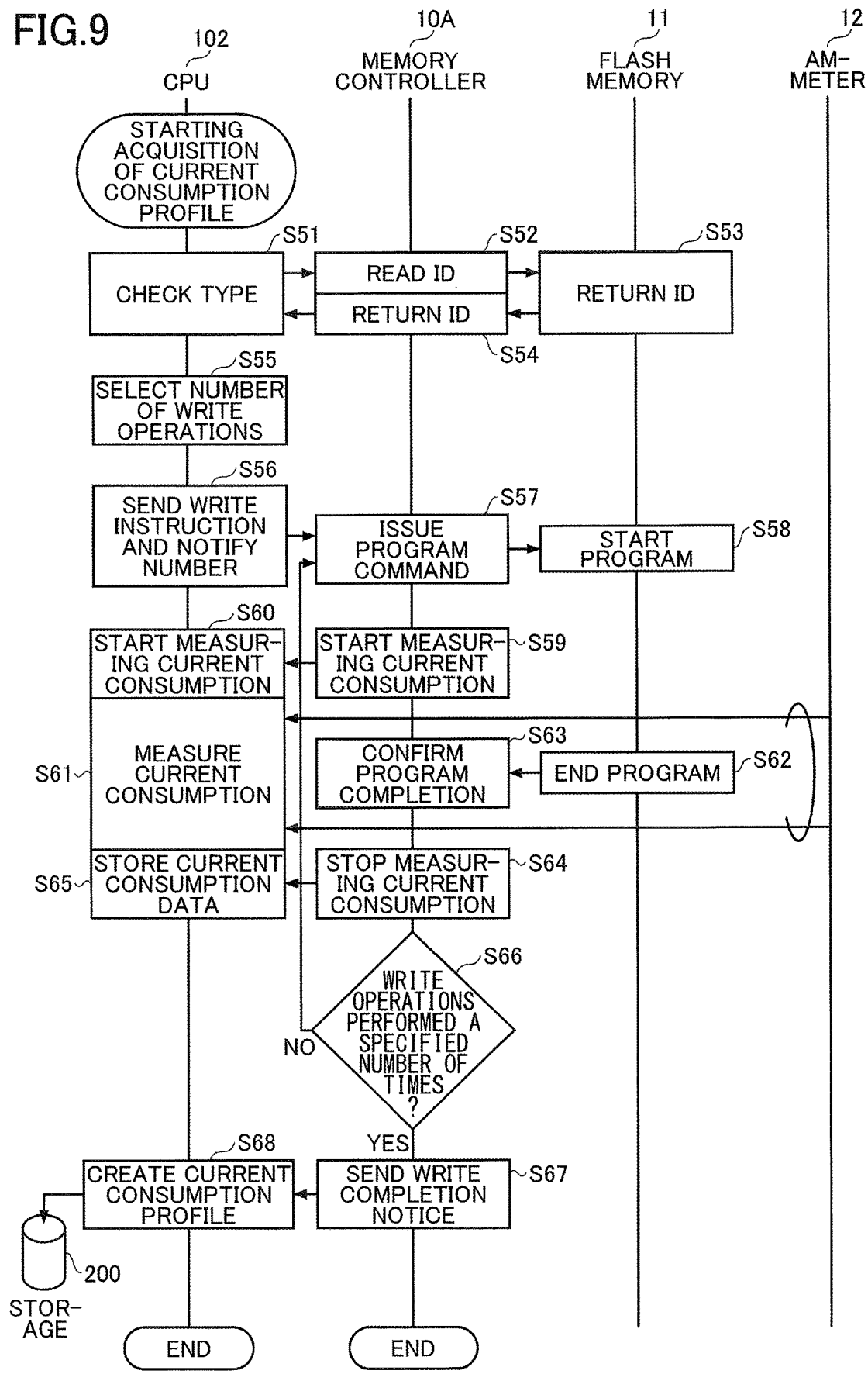
FIG. 9 is a flowchart illustrating an example of the method of acquiring data indicative of a distribution of total current consumption by use of the write control apparatus illustrated in FIG. 8.

FIG. 9 is a flowchart illustrating an example of the method of acquiring data indicative of a distribution of total current consumption by use of the write control apparatus illustrated in FIG. 8. The processes from step S51 to step S58 illustrated in FIG. 9 are equivalent to the processes from step S1 to step S8 in the flowchart illustrated in FIG. 4, and a description thereof will be omitted.

In step S59, the memory controller 10A notifies the CPU 102 of the timing at which to start measuring current consumption. In step S60, the CPU 102 starts measuring current consumption. In step S61, the CPU 102 continues measuring current consumption. Specifically, the output value of the ammeter 12 (i.e., a digital value indicative of current) is detected at predetermined sampling intervals, and the sum of detected values is calculated. Calculation of the sum may be performed concurrently with the detection of each sampled value, or may be performed after the detection of all the sampled values is completed.

In step S62, the flash memory 11 completes the write operation. In step S63, the memory controller 10A, which is monitoring the ready/busy signal, for example, detects that the write operation of the flash memory 11 is completed. In step S64, in response to the completion of the write operation, the memory controller 10A notifies the CPU 102 of the timing at which to stop the measurement of current consumption. In step S65, the CPU 102 temporarily stores the measured total current consumption value in the internal register.

In step S66, the memory controller 10A determines whether a write command has been executed a specified number of times. When the write command has not been executed the specified number of times, the memory controller 10A repeats the process of step S57 and the subsequent processes. When the write command has already been executed the specified number of times, in step S67, the memory controller 10A sends a write completion notice to the CPU 102.

In step S68, the CPU 102 creates a distribution profile based on a plurality of measured total current consumption values in response to the write completion notification. The CPU 102 further stores data indicative of the distribution of total current consumption in a data storage area such as the data storage 200. The data to be stored may be histogram data representing the distribution of total current consumption, profile data representing the envelope, data reflecting the distribution (i.e., a center value, a standard deviation, a maximum allowable value, etc.), or a combination thereof.

With the above-noted process, the procedure for acquiring data indicative of a distribution of total current consumption comes to an end.

Figure 10:
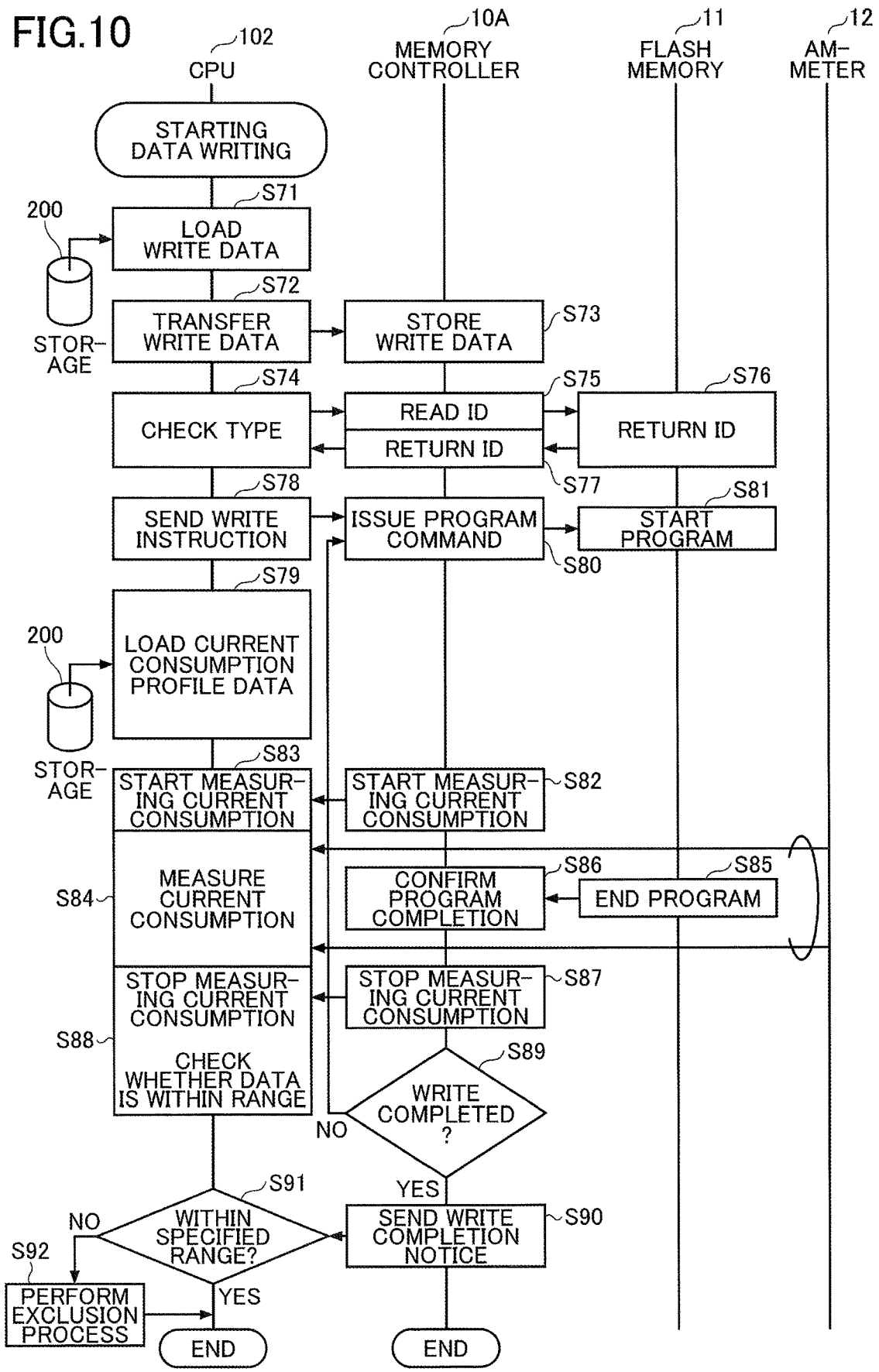
FIG. 10 is a flowchart illustrating an example of the method of determining whether a memory device is satisfactory or defective upon writing actual data.

FIG. 10 is a flowchart illustrating an example of the method of determining whether a memory device is satisfactory or defective upon writing actual data. The procedure of the flowchart illustrated in FIG. 10 is performed by the write control apparatus illustrated in FIG. 8 when actual data are written. The processes from step S71 to step S81 illustrated in FIG. 10 are equivalent to the processes from step S21 to step S31 in the flowchart illustrated in FIG. 7, and a description thereof will be omitted.

In step S82, the memory controller 10A notifies the CPU 102 of the timing at which to start measuring current consumption. In step S83, the CPU 102 starts measuring current consumption. In step S84, the CPU 102 continues measuring current consumption. Specifically, the output value of the ammeter 12 (i.e., a digital value indicative of current) is detected at predetermined sampling intervals, and the sum of detected values is calculated. Calculation of the sum may be performed concurrently with the detection of each sampled value, or may be performed after the detection of all the sampled values is completed.

In step S85, the flash memory 11 completes the write operation. In step S86, the memory controller 10A, which is monitoring the ready/busy signal, for example, detects that the write operation of the flash memory 11 is completed. In step S87, in response to the completion of the write operation, the memory controller 10A notifies the CPU 102 of the timing at which to stop the measurement of current consumption. In step S88, the CPU 102 determines whether the measured total current consumption value is within an acceptable range based on the data indicative of a distribution. More specifically, a check may be made as to whether the notified total current consumption value is greater than the maximum allowable value of total current consumption.

In step S89, the memory controller 10A determines whether the write command for the specified write data is completed, thereby determining whether the write operation is completed. The write data received and stored in step S73 may be 300 words, and a word-specific write command may be used, for example. In such a case, a check is made as to whether write operations are performed 300 times. When the write operation is not completed, the memory controller 10A repeats the process of step S80 and the subsequent processes. When the write operation is completed, the memory controller 10A in step S90 sends a write completion notice to the CPU 102.

In step S91, in response to the write completion notice, the CPU 102 determines whether the total current consumption values for the memory device or the memory area of interest are within the specified acceptable range according to the determination made in step S88. When the value does not fall within the specified range, the CPU 102 in step S92 performs an exclusion process. Specifically, the CPU 102 may output the result of determination indicating that the memory device or memory area of interest is defective. The term "output" means, for example, that the result of determination may be stored in a data storage, may be indicated on a display screen, or transmitted to the outside as a notice. The result of determination may specify only the memory device, or may further specify the identified defective memory area in addition to the memory device. Upon determining that the memory area subjected to a write operation at this time is defective, the CPU 102 may control subsequent write operations such as to avoid using the address of this memory area.

With the above-noted process, the procedure for determining whether the memory device is satisfactory or defective upon writing actual data comes to an end.

Figure 11:
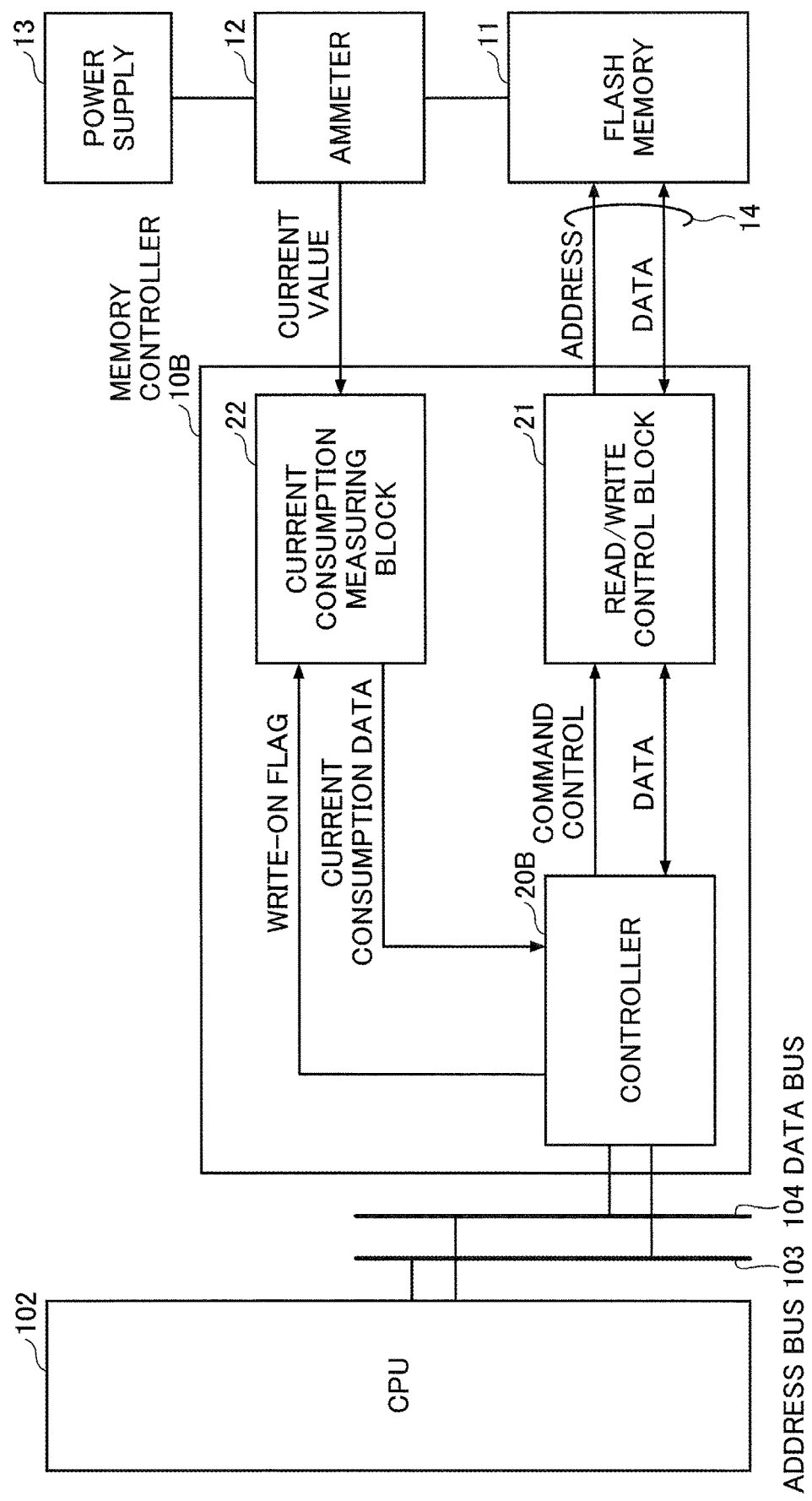
FIG. 11 is a drawing illustrating yet another example of the configuration of a write control apparatus.

FIG. 11 is a drawing illustrating yet another example of the configuration of a write control apparatus. The write control apparatus illustrated in FIG. 11 includes a CPU 102, an address bus 103, a data bus 104, a memory controller 10B, a flash memory 11, a ammeter 12, and a power supply 13. The write control apparatus may be, for example, a computer or the like. The power supply 13 may be embedded in, or external to, the write control apparatus. The flash memory 11, to which data is written, may be a memory unit that is fixedly embedded in the write control apparatus, or an exchangeable memory unit.

The memory controller 10B differs from the memory controller 10 illustrated in FIG. 1 in that a controller 20B has the function to create a current consumption profile and the function to perform an exclusion process. Further, the memory controller 10B is connected to the CPU 102 via the address bus 103 and the data bus 104.

FIG. 12 is a flowchart illustrating an example of the method of acquiring data indicative of a distribution of total current consumption as performed by the write control apparatus illustrated in FIG. 11.

In step S101, the CPU 102 sends an instruction for acquiring a current consumption profile to the memory controller 10B. In step S102, the memory controller 10B responds to the instruction for acquiring a current consumption profile by sending a command to the flash memory 11 for reading an identifier indicative of the type. In step S103, the flash memory 11 sends identifier data in response to the read command. In step S104, the memory controller 10B receives the identifier data from the flash memory 11, and stores the received identifier data in the internal memory area, register, or the like. In step S105, the memory controller 10B detects the type of the flash memory 11 based on the received identifier data.

In step S106, the memory controller 10B selects the number of write operations to be performed with respect to the flash memory 11. In step S107, the memory controller 10B issues a write command (i.e., program command) to the flash memory 11. In step S108, the flash memory 11 starts a write operation (i.e., program operation). This write operation corresponds to the execution of a single write command with respect to a memory area of a specified write unit (byte, word, etc.) to which the issued write command is directed.

In step S109, the memory controller 10B starts measuring current consumption. Specifically, the process started here involve detecting the output value of the ammeter 12 (i.e., a digital value indicative of current) at predetermined sampling intervals and calculating the sum of detected values. Calculation of the sum may be performed concurrently with the detection of each sampled value, or may be performed after the detection of all the sampled values is completed.

In step S110, the flash memory 11 completes the write operation. In step S86, the memory controller 10B, which is monitoring the ready/busy signal, for example, detects that the write operation of the flash memory 11 is completed. In step S112, the memory controller 10B stops measuring current consumption in response to the completion of a write operation, and temporarily stores the measured total current consumption value in the internal register or the like.

In step S113, the memory controller 10B determines whether a write command has been executed a specified number of times. When the write command has not been executed the specified number of times, the memory controller 10B repeats the process of step S107 and the subsequent processes. When the write command has already been executed the specified number of times, in step S114, the memory controller 10B creates a distribution profile based on the measured total current consumption values. The memory controller 10B further stores data indicative of the distribution of total current consumption in an internal memory area, a register, or the like, or in a data storage area such as the data storage 200. The data to be stored may be histogram data representing the distribution of total current consumption, profile data representing the envelope, data reflecting the distribution (i.e., a center value, a standard deviation, a maximum allowable value, etc.), or a combination thereof.

With the above-noted process, the procedure for acquiring data indicative of a distribution of total current consumption comes to an end.

Figure 13:
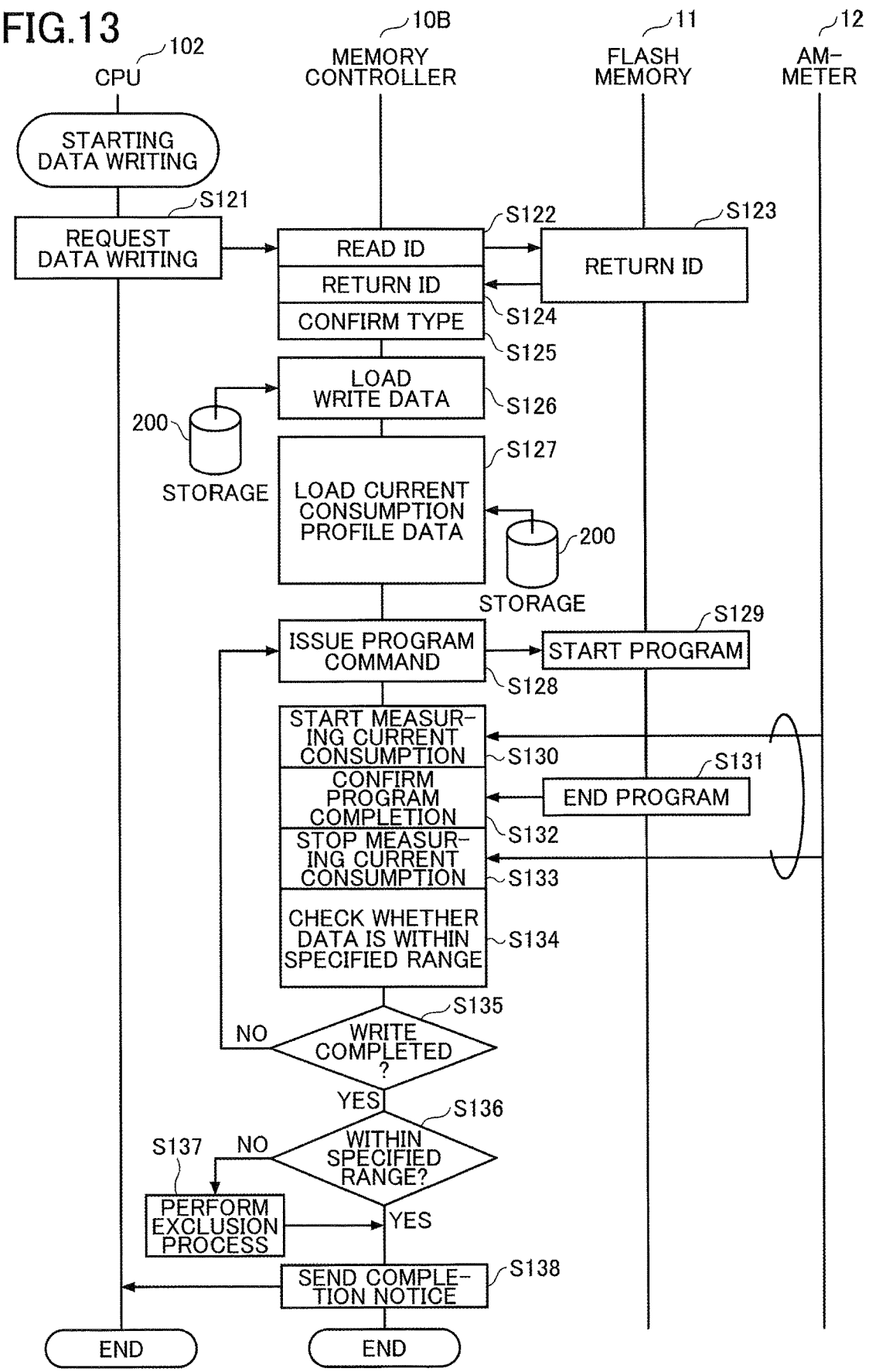
FIG. 13 is a flowchart illustrating an example of the method of determining whether a memory device is satisfactory or defective upon writing actual data.

FIG. 13 is a flowchart illustrating an example of the method of determining whether a memory device is satisfactory or defective upon writing actual data. The procedure of the flowchart illustrated in FIG. 13 is performed by the write control apparatus illustrated in FIG. 11 when actual data are written.

In step S121, the CPU 102 instructs the memory controller 10B to write data. In step S122, the memory controller 10B sends a command to the flash memory 11 for reading an identifier indicative of the type. In step S123, the flash memory 11 sends identifier data in response to the read command. In step S124, the memory controller 10B receives the identifier data from the flash memory 11, and stores the received identifier data in the internal memory area, register, or the like. In step S125, the memory controller 10B detects the type of the flash memory 11 based on the received identifier data.

In step S126, the memory controller 10B loads write data from the data storage 200 or the like. This write data is to be written to the flash memory 11 that is to be incorporated in the product. In step S127, the memory controller 10B reads from the data storage 200 or the like the profile data of total current consumption, which is to be used to determine whether a memory area is satisfactory or defective. Specifically, the memory controller 10B reads from the data storage the data having a file name corresponding to a write command type selected among the plurality of types of write commands, which are available for the memory device that has the confirmed type.

In step S128, the memory controller 10B issues a write command (i.e., program command) of the selected type to the flash memory 11. In step S129, the flash memory 11 starts a write operation (i.e., program operation). This write operation corresponds to the execution of a single write command with respect to a memory area of a specified write unit (byte, word, etc.) to which the issued write command is directed.

In step S130, the memory controller 10B starts measuring current consumption. Specifically, the process started here involve detecting the output value of the ammeter 12 (i.e., a digital value indicative of current) at predetermined sampling intervals and calculating the sum of detected values. Calculation of the sum may be performed concurrently with the detection of each sampled value, or may be performed after the detection of all the sampled values is completed.

In step S131, the flash memory 11 completes the write operation. In step S11, the memory controller 10, which is monitoring the ready/busy signal, for example, detects that the write operation of the flash memory 11 is completed. In step S133, the memory controller 10 stops measuring current consumption in response to the completion of the write operation.

In step S134, the memory controller 10B determines whether the measured total current consumption value is within an acceptable range based on the data indicative of a distribution. More specifically, a check may be made as to whether the measured total current consumption value is greater than the maximum allowable value of total current consumption.

In step S135, the memory controller 10B determines whether the write command for the specified write data is completed, thereby determining whether the write operation is completed. When the write operation is not completed, the memory controller 10 repeats the process of step S128 and the subsequent processes. When the write operation is completed, in step S136, the memory controller 10B determines whether the total current consumption values for the memory device or the memory area of interest are within the specified acceptable range according to the determination made in step S134. When the value does not fall within the specified range, the memory controller 10B in step S137 performs an exclusion process. Specifically, the memory controller 10B may output the result of determination indicating that the memory device or memory area of interest is defective. The term "output" means, for example, that the result of determination may be stored in a data storage, may be indicated on a display screen, or transmitted to the outside as a notice. The result of determination may specify only the memory device, or may further specify the identified defective memory area in addition to the memory device. Upon determining that the memory area subjected to a write operation at this time is defective, the memory controller 10B may control subsequent write operations such as to avoid using the address of this memory area.

In step S138, the memory controller 10B sends a data write completion notice to the CPU 102. With the above-noted process, the procedure for determining whether the memory device is satisfactory or defective upon writing actual data comes to an end.

Figure 14:
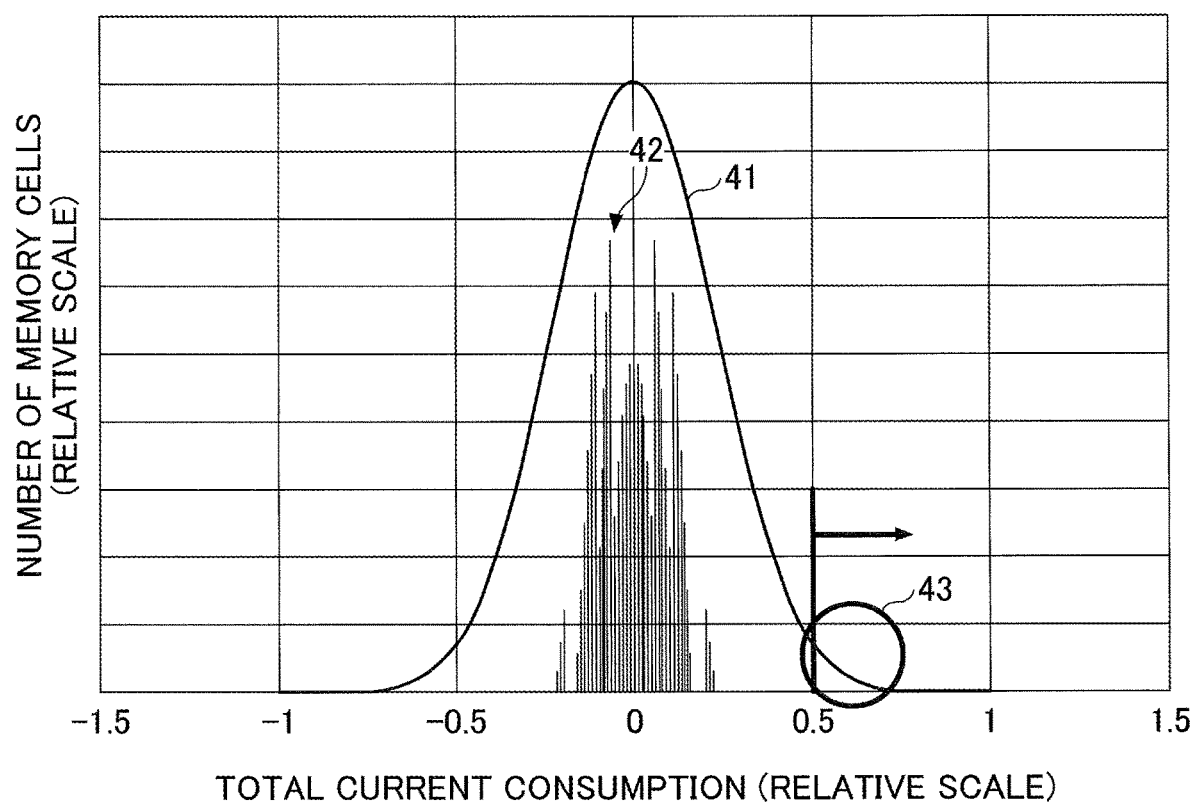
FIG. 14 is a drawing illustrating an example of the distribution of total current consumption measured during the time of actual data writing.

FIG. 14 is a drawing illustrating an example of the distribution of total current consumption measured during the time of actual data writing. In FIG. 8, the horizontal axis represents total current consumption indicated in relative values (i.e., values normalized to a standard range), and the vertical axis represents the frequency of occurrences of respective total current consumption values. The distribution profile 41 illustrated in FIG. 11 is an example of a frequency distribution profile illustrating a distribution of total current consumption measured in advance for a memory device of a particular type.

An actual data distribution 42 is a histogram that is obtained by cumulatively recording total current consumption values measured at the time of writing actual data to a memory device of the same type as described above and by creating data indicative of frequency of occurrences of respective total current consumption values. In the flowcharts in FIG. 7, FIG. 10, and FIG. 13, total current consumption values for actual data are not cumulatively collected. The actual data distribution 42 illustrated in FIG. 14 is the histogram data that would be obtained if total current consumption values for actual data were cumulatively collected.

For the distribution profile 41, a maximum allowable value 43 of total current consumption is set to 0.5, for example, by taking into account the field of use of the memory device. In the memory areas corresponding to the total current consumption values greater than this maximum value 43, memory cells will be considered to be defective due to the rapid deterioration of data retention characteristics.

As illustrated in FIG. 14, the actual data distribution 42 has a narrower spread than the distribution profile 41. In FIG. 14, for the sake of illustration, the histogram of the actual data distribution 42 is illustrated such that a spread of the actual data distribution 42 is substantially narrower than a spread of the distribution profile 41. However, the distribution profile 41 and the actual data distribution 42 obtained for the same type of memory device are not much different in reality.

When the actual data distribution 42 for the memory device to which actual data are written has a spread narrower than the spread of the distribution profile 41 as illustrated in FIG. 14, most of the memory areas of this memory device will be considered to be not defective. Namely, there are almost no memory areas for which the total current consumption value is greater than the maximum allowable value of 0.5. In the case in which such a memory device is used for storing FPGA configuration data, for example, the memory device is unlikely to be discarded as a defective device and replaced with another device that is problem-free. In the case in which such a memory device is used for storing log information, for example, there are almost no addresses that are unsuitable for use and unused in the memory device.

Figure 15:
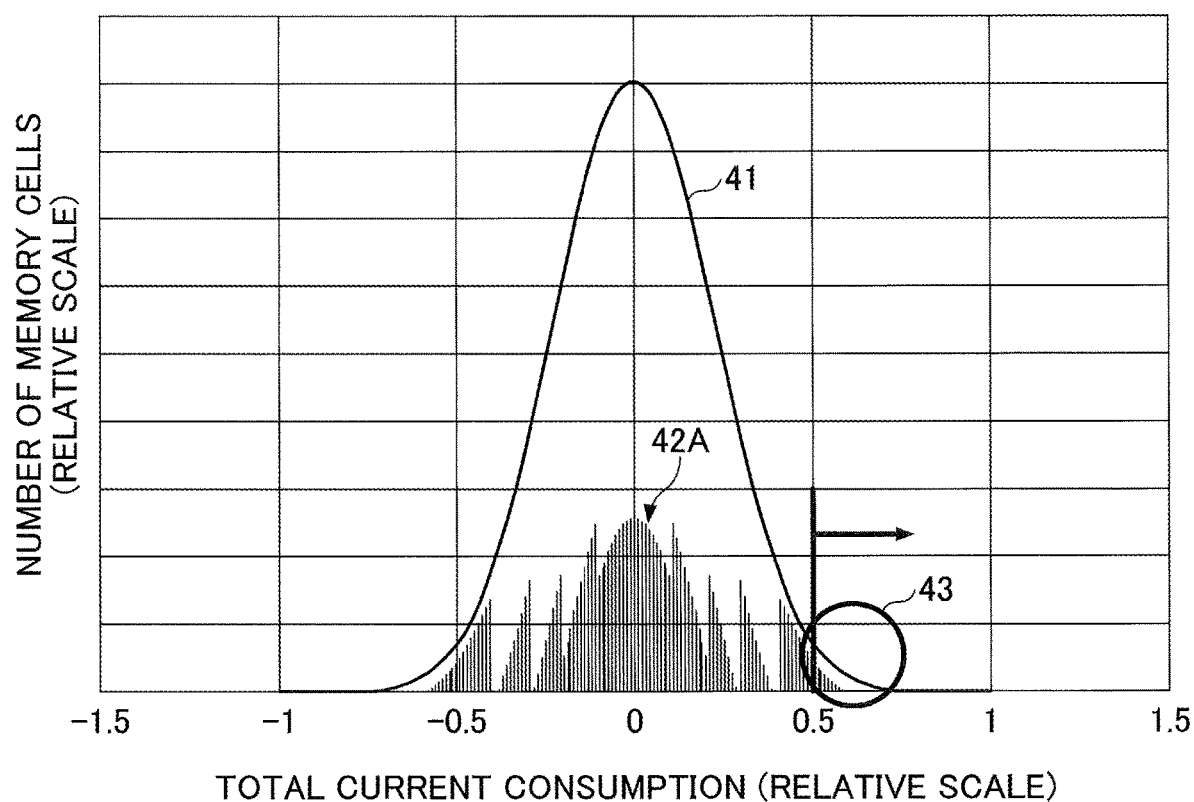
FIG. 15 is a drawing illustrating another example of the distribution of total current consumption measured during the time of actual data writing.

FIG. 15 is a drawing illustrating another example of the distribution of total current consumption measured during the time of actual data writing. In FIG. 15, the horizontal axis represents total current consumption indicated in relative values (i.e., values normalized to a standard range), and the vertical axis represents the frequency of occurrences of respective total current consumption values.

The distribution profile 41 is an example of a frequency distribution profile illustrating a distribution of total current consumption measured in advance for a memory device of a particular type. An actual data distribution 42A is a histogram that is obtained by cumulatively recording total current consumption values measured at the time of writing actual data to a memory device of the same type as described above and by creating data indicative of frequency of occurrences of respective total current consumption values.

In the example illustrated in FIG. 15, the actual data distribution 42A has a wider spread than the actual data distribution 42 illustrated in FIG. 14. In the case of the actual data distribution 42A, a relatively large number of memory areas in the memory device will be considered to be defective upon evaluation. Namely, there are a relatively large number of memory areas for which the total current consumption value is greater than the maximum allowable value of +0.5. In the case in which such a memory device is used for storing FPGA configuration data, for example, the memory device is likely to be discarded as a defective device and replaced with another device that is problem-free. In the case in which such a memory device is used for storing log information, for example, there are a relatively large number of addresses that are unsuitable for use and unused in the memory device.

Figure 16:
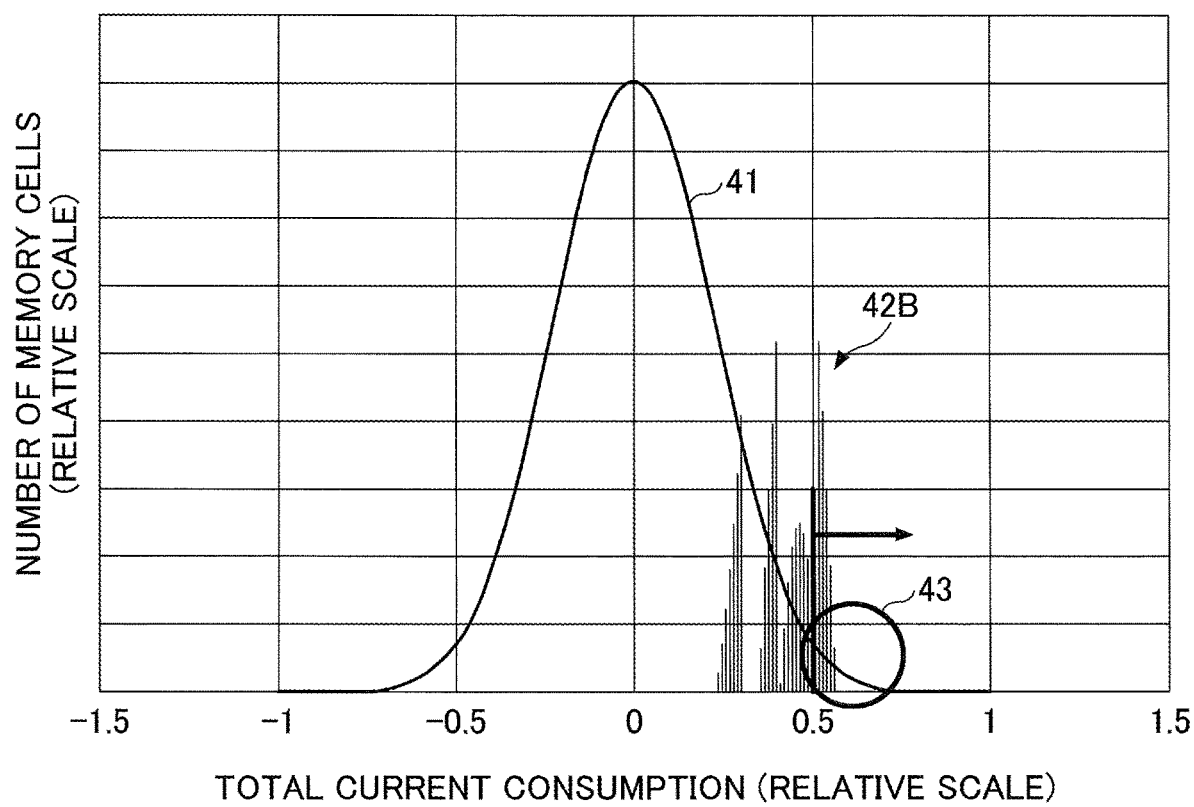
FIG. 16 is a drawing illustrating another example of the distribution of total current consumption measured during the time of actual data writing.

FIG. 16 is a drawing illustrating another example of the distribution of total current consumption measured during the time of actual data writing. In FIG. 16, the horizontal axis represents total current consumption indicated in relative values (i.e., values normalized to a standard range), and the vertical axis represents the frequency of occurrences of respective total current consumption values.

The distribution profile 41 is an example of a frequency distribution profile illustrating a distribution of total current consumption measured in advance for a memory device of a particular type. An actual data distribution 42B is a histogram that is obtained by cumulatively recording total current consumption values measured at the time of writing actual data to a memory device of the same type as described above and by creating data indicative of frequency of occurrences of respective total current consumption values.

In the example illustrated in FIG. 16, the actual data distribution 42B has a narrower spread than the distribution profile 41. However, the total current consumption values of the actual data distribution 42B have a center value that is off the center of the distribution profile 41, and many of the measured values are distributed from about 0.25 to about 0.6. In such a case, despite the sufficiently narrow spread of the actual data distribution 42B, a relatively large number of memory areas in the memory device will be considered to be defective upon evaluation. Namely, there are a relatively large number of memory areas for which the total current consumption value is greater than the upper limit "0.5" of the allowable range of total current consumption. In the case in which such a memory device is used for storing FPGA configuration data, for example, the memory device is likely to be discarded as a defective device and replaced with another device that is problem-free. In the case in which such a memory device is used for storing log information, for example, there are a relatively large number of addresses that are unsuitable for use and unused in the memory device.

In the embodiments described heretofore, the use of a NOR-type flash memory has been taken for granted. In the case of a NAND-type flash memory, the controller ensures the validity of stored data with higher reliability than in the case of a NOR-type flash memory. Nevertheless, the present invention may also be applicable to a NAND-type flash memory. Further, the present invention is applicable to any type of nonvolatile memory device in addition to a flash memory, as long as the nonvolatile memory device is such that total current consumption values vary at the time of writing, and such that the larger the total current consumption value is, the faster the memory cells deteriorate.

According to at least one embodiment, a write area that is highly likely to present a problem in the data retention property in the long run can be identified during data write operation in a nonvolatile memory cell.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An apparatus for memory control, comprising:
   a data storage area configured to store data indicative of a distribution of total current consumption required for a write operation as measured with respect to one or more nonvolatile memory devices of a first type; and
   a control apparatus configured to evaluate, based on the data indicative of the distribution, a degree to which a total amount of current consumption required for a write operation with respect to a memory area in a nonvolatile memory device of the same first type, regarding a current flowing from a power supply to the nonvolatile memory device during the write operation, is deviated toward larger total current consumptions in the distribution, thereby determining whether the memory area is satisfactory.

2. The apparatus as claimed in claim 1, wherein the data indicates a maximum allowable value of total current consumption regarding deterioration of data retention characteristics, and the control apparatus determines that the memory area is defective when the total amount of current consumption is greater than the maximum allowable value.

3. The apparatus as claimed in claim 2, wherein the maximum allowable value varies depending on a field of use of the nonvolatile memory device of the same first type.

4. The apparatus as claimed in claim 1, wherein the control apparatus is configured to transmit to an outside a signal indicative of a defect upon determining that the memory area is defective.

5. A method of determining whether a nonvolatile memory is defective, comprising:
   accessing a data storage area to retrieve data indicative of a distribution of total current consumption required for a write operation as measured in advance with respect to one or more nonvolatile memory devices of a first type;
   measure a total amount of current consumption required for a write operation with respect to a memory area in a nonvolatile memory device of the same first type, regarding a current flowing from a power supply to the nonvolatile memory device during the write operation; and
   evaluating, based on the data indicative of the distribution, a degree to which the total amount of current consumption is deviated toward larger total current consumptions in the distribution, thereby determining whether the memory area is satisfactory.

* * * * *